United States Patent [19]

Yamada et al.

[11] Patent Number: 5,427,977
[45] Date of Patent: Jun. 27, 1995

[54] METHOD FOR MANUFACTURING POROUS SEMICONDUCTOR LIGHT EMITTING DEVICE

[75] Inventors: Masao Yamada; Motoo Nakano, both of Kawasaki, Japan; George J. Collins, Fort Collins, Colo.; Tetsuro Tamura; Akira Takazawa, both of Kawasaki, Japan

[73] Assignee: Fujitsu Limited, Kawasaki, Japan

[21] Appl. No.: 179,038

[22] Filed: Jan. 6, 1994

Related U.S. Application Data

[62] Division of Ser. No. 53,562, Apr. 28, 1993, Pat. No. 5,331,180.

[30] Foreign Application Priority Data

| | | | |
|---|---|---|---|
| Apr. 30, 1992 | [JP] | Japan | 4-138075 |
| Jul. 22, 1992 | [JP] | Japan | 4-195650 |
| Aug. 19, 1992 | [JP] | Japan | 4-220292 |
| Aug. 28, 1992 | [JP] | Japan | 4-230156 |
| Aug. 28, 1992 | [JP] | Japan | 4-230160 |
| Mar. 19, 1993 | [JP] | Japan | 5-060595 |

[51] Int. Cl.$^6$ .......................... H01L 21/20
[52] U.S. Cl. ..................... 437/127; 437/71; 437/129; 437/132; 437/174; 437/173; 437/248
[58] Field of Search .............. 437/71, 129, 132, 173, 437/174, 248, 127

[56] References Cited

U.S. PATENT DOCUMENTS

| | | | |
|---|---|---|---|
| 4,532,700 | 8/1985 | Kinney et al. | 437/71 |
| 4,628,591 | 12/1986 | Zorinsky et al. | 437/71 |
| 5,258,322 | 11/1993 | Sakaguchi et al. | 437/71 |

FOREIGN PATENT DOCUMENTS

| | | | |
|---|---|---|---|
| 0110247 | 9/1981 | Japan | 437/71 |
| 0144149 | 8/1984 | Japan | 437/71 |

OTHER PUBLICATIONS

Imai et al. in "Journal of crystal growth 63", 1983, pp. 547–553.
Cullis et al. in "Nature 353, Sep. 1991, 335–338".
Beale et al., "An Experimental and Theoretical Study of the Formation and Microstructure of Porous Silicon," Journal Of Crystal Growth, vol. 73 (1975) North–Holland, Amsterdam, pp. 622–636.
Ojio et al., "Highly Transparent and Conducting Polypyrrole-Poly(vinyl alcohol) Composite Films Prepared by Gas State Polymerization," Polymer Journal, vol. 18, No. 1 (1986), pp. 95–98.
L. T. Canham, "Silicon Quantum Wire Array Fabrication by Electrochemical and Chemical Dissolution of Wafers," Appl. Phys. Lett, vol. 57, No. 10, Sep. 3, 1990, pp. 1046–1048.
Lehmann et al., "Porous Silicon Formation: A Quantum Wire Effect," Appl. Phys. Lett, vol. 58, No. 8, Feb. 25, 1991, pp. 856–858.
Koshida et al., "Efficient Visible Photoluminescence from Porous Silicon," Japanese Journal of Applied Physics, vol. 30, No. 7B, Jul. 1991, pp. L1221–L1223.
Whang et al., "Polypyrroles Prepared by Chemical Oxidative Polymerization at Different Oxidation Potentials," Synthetic Metals, vol. 45 (1991), pp. 151–161.
Han et al., "Highly Electrically Conducting Polymer Blends," Synthetic Metals, vol. 45 (1991), pp. 261–264.
K. Betsui, "Fabrication and Characteristics of Si Field Emitter Arrays," Technical Digest of UVMC-91, Nagahama, Japan, 1991, pp. 26–29.

*Primary Examiner*—R. Bruce Breneman
*Assistant Examiner*—Ramamohan Rao Paladugu
*Attorney, Agent, or Firm*—Staas & Halsey

[57] ABSTRACT

An Si or SiC semiconductor layer is subjected to anodic oxidation in an HF solution to form a porous semiconductor layer. Without drying, the porous semiconductor layer is then immersed in pure water. Ultrasonic waves applied to the pure water shorten the reaction time and help bubbles separate from the surface of the porous region. The porous semiconductor layer is used for forming a pn junction, and carriers are injected into the pn junction.

24 Claims, 27 Drawing Sheets

Fig.9

| SAMPLE | | TEMP (°C) | TIME (min) | PL PEAK (nm) |
|---|---|---|---|---|
| S1 | DEIONIZED WATER + SUPERSONIC TREATMENT | 24 | 60 | 710 |
| S2 | DEIONIZED WATER + SUPERSONIC TREATMENT | 45 | 30 | 675 |
| S3 | DEIONIZED WATER + SUPERSONIC TREATMENT | 45 | 60 | 620 |
| S4 | DEIONIZED WATER | 70 | 3 | 610 |
| S5 | $F_2$ GAS | 24 | 10 | 600 |

METHOD FOR MANUFACTURING POROUS SEMICONDUCTOR LIGHT EMITTING DEVICE

CROSS REFERENCE TO RELATED APPLICATION

The present application is a divisional application divided from application Ser. No. 08/053,562 filed on Apr. 28, 1993, now U.S. Pat. No. 5,331,180.

BACKGROUND OF THE INVENTION a) Field of the Invention

The present invention relates generally to a semiconductor light emitting device and a method of manufacturing the same, and particularly to a porous semiconductor light emitting device and a method of manufacturing the same, in which a radiative mechanism is obtained through the use of porous fine wires.

Silicon (Si) light emitting devices which have previously been considered impossible to manufacture are now being realized through the provision of a porous region formed in Si using hydrofluoric acid. Si light emitting devices alleviate problems encountered in the implementation of photoelectric integrated circuits on Si wafers, and open the way to optical coupling between wafers and to other technologies.

b) Description of the Related Art

Silicon has indirect band gaps, and is generally not considered to be suitable for use in preparing light emitting devices. For this reason, materials such as GaAs, InP or the like having direct band gaps have been used conventionally in constructing such devices.

It has been discovered, however, that Si provides a radiative mechanism when it undergoes anodic oxidation in an aqueous solution of hydrofluoric acid whereby a thin wire porous structure is formed on the surface thereof. It has been found that when an exciting light is applied to a porous silicon structure having poles which are 10 nm or less in diameter, light is emitted in the order of 1.4 to 1.6 eV (L. T. Canham, Appl. Phys. Lett., 57(10), 1046 (1990), V. Lehmann and U. Gosele, Appl. Phys. Lett., 58(8), 856 (1991), N. Koshida and H. Koyama, Jpn. J. Appl. Phys., 30(7B), L1221 (1991)).

It is believed that this phenomenon results from pseudo direct transition between bands because of sub bands of a limited size formed in the silicon region.

The band gap E allowing recombination transition is defined by the relationship $(h^2/4m_e^*d^2 + h^2em_h^*d^2)$ where d is the width of a potential well, h is the Planck constant, and $m_e^*$ and $m_h^*$ are the effective masses of electron and hole. The wavelength of emitted light becomes shorter as the width of a potential well becomes narrower. The radiative phenomenon may result from the quantum effect of the miniaturization of the silicon region to the size of about 5 nm or less.

One method of making a super fine silicon region, is to form the Si into fine particles. This method is associated, however, with particle distortion, thus lowering the light emission efficiency. It is also difficult to inject carriers into fine particles.

Another method of making a super fine silicon region is the method proposed by L. T. Canham, whereby the silicon region is made porous by way of anodic oxidation (L. T. Canham, Appl. Phys. Lett., 57(10), 1046 (1990)).

In the anodic oxidation procedure, a Si wafer with an electrode formed on the back surface thereof is immersed in an aqueous solution of HF. A d.c. power source is connected between the Si wafer electrode and a counter metal electrode which also is immersed in the HF solution.

The Si wafer electrode is used as the anode, and the counter metal electrode is used as the cathode. Under these conditions, anodic oxidation occurs on the front surface of the Si wafer. The oxide film formed by anodic oxidation immediately dissolves in the HF aqueous solution. Holes are essential for the anodic oxidation process. A p-type Si is therefore used, or electron-hole pairs are generated by applying light to a Si wafer.

The surface of the Si wafer in the HF aqueous solution is etched by anodic oxidation, and fine pores or recesses are formed at local areas where the etching speed is great. Once recesses are formed, the electric field concentrates at these local areas so that holes are produced from the inside of the bulk to allow selective etching. Since the electric field concentrates at the bottom areas of the recesses having a large radius of curvature, the etched recesses do not extend in the lateral direction but extend generally in the depth direction.

In the above manner, a porous region is formed at the Si wafer surface. The porosity depends on the HF concentration of the HG aqueous solution, the electric power, the carrier concentration, and other factors. When the porosity exceeds 50%, the recesses become interconnected and a cluster of Si wires having fine poles is formed. In this manner, Si quantum wires having a diameter of 5 nm or less are obtained to thereby present the quantum effect.

SUMMARY OF THE INVENTION

Although the possibility of providing a semiconductor light emitting device using porous Si has been presented, practical technologies for preparing such devices have not yet been developed to a sufficient degree.

It is an object of the present invention to provide a novel light emitting semiconductor device having a porous quantum wire structure.

It is another object of the present invention to provide a Si light emitting device capable of emitting light upon electrical excitement.

It is a further object of the present invention to provide a novel Si light emitting device and a method of manufacturing the same, in which the device includes a porous Si or Si quantum wire cluster that can be electrically excited so as to emit light and the brittle structure of the porous Si is reinforced.

It is a still further object of the present invention to provide a Si light emitting device which has stabilized Si quantum wires and which is provided with electrical means for injecting carriers into a Si quantum wire cluster formed by an anodic oxidation process.

Another object of the present invention is to provide a novel method of manufacturing light emitting semiconductor devices having a porous quantum wire structure.

Yet another object of the present invention is to provide a method of manufacturing a Si light emitting device capable of forming a well defined cluster of Si quantum wires having desired properties.

A further object of the present invention is to provide a method of manufacturing a Si light emitting device which has stabilized Si quantum wires and which is provided with electrical means for injecting carriers into a Si quantum wire cluster formed through the use of an anodic oxidation process.

According to one aspect of the present invention, a semiconductor light emitting device is provided. The device comprises a first Si or SiC semiconductor layer of a first conductivity type and a second layer facing the first semiconductor layer. The first semiconductor layer includes a porous region comprising a quantum wire cluster having a transition energy different from the bulk state thereof and which is formed at least at a surface region of the first semiconductor layer. The second layer is formed on the surface of the porous region and has a function of supplying carriers of a second conductivity type. The porous region and the second layer form a diode structure.

The second layer may be formed as a thermally oxidized layer covering the porous region and a second conductivity type semiconductor layer formed on the thermally oxidized layer.

The diode structure formed using the porous region of quantum wires allows the quantum wires to produce light emission by electrical excitation.

By forming an oxide film by oxidizing Si or SiC quantum wires, the diameter of the quantum wire can be substantially reduced without raising the porosity.

With a forward bias, hot carriers tunnelling the i layer of the pin junction containing quantum wires are injected into the quantum wires. Minority carriers go over the potential of the depletion layer formed on the surface of the quantum wires and reach the inside of the quantum wires, to thereby produce recombination. With a reverse bias, a high electric field is generated within the quantum wires so that electron-hole pairs are generated by an avalanche breakdown, to thereby produce the recombination.

According to another aspect of the present invention, there is provided a semiconductor light emitting device comprising a light emission layer including a cluster of SiC quantum wires having a diameter of 10 nm or less, and electrically exciting means connected to the light emission layer.

A SiC semiconductor has a relatively broad band gap. By transforming SiC into quantum wires, the band gap changes to the high energy side. By using a cluster of SiC quantum wires having a suitable diameter, it is possible to emit light having a desired wavelength.

According to a further aspect of the present invention, there is provided a Si light emitting device comprising an SOI substrate having a laminated structure of a Si layer, an insulating layer, and a support substrate, the support substrate and the insulating layer being formed with an opening at the area corresponding to a predetermined area of the Si layer, a porous Si region formed in the Si layer at the predetermined area, an n-type region formed in the Si layer at the area adjacent to the predetermined area of the Si layer, and a p-type region formed in the Si layer at the area adjacent to the predetermined area of the Si layer and facing the n-type region.

Since the porous Si region and the n-type and p-type regions sandwiching the porous Si region are formed in the Si layer of the SOI substrate, a lateral type diode structure is provided. The anode and cathode regions of the diode can be exposed to the surface.

By separating the lateral diode structures on an SOI substrate, it is possible to provide Si light emitting elements which are electrically isolated.

According to still a further aspect of the present invention, there is provided a Si light emitting device comprising a p-type porous Si layer of quantum wires, an n-type conductive polymer layer forming a pn junction with the porous Si layer, and electrodes for the p-type porous Si layer and the n-type conductive polymer layer.

The conductive polymer is preferably formed from a polypyrrole derivative, a polyacetylene derivative, or a polyaniline derivative. The conductive polymer layer is preferably deposited on the porous Si layer by an electrochemical film forming method or a vapor film forming method.

The p-type porous Si layer and n-type conductive polymer layer are coupled together and a forward or reverse bias voltage is applied between the respective electrodes to produce light emission by the recombination of electrons injected into the porous Si layer.

The conductive polymer layer contacting the porous Si layer provides a function of reinforcing otherwise brittle quantum wires.

According to another aspect of the present invention, there is provided a porous semiconductor light emitting device comprising a Si or SiC porous semiconductor layer, a transparent conductive film formed on the surface of the porous semiconductor layer and having an area which is much smaller than the porous semiconductor layer, and a conductive film formed on the other surface of the porous semiconductor layer on the opposite side of the transparent conductive film and having an area which is much larger than the transparent conductive film.

According to a further aspect of the present invention, there is provided a porous semiconductor light emitting device comprising a Si or SiC porous semiconductor layer and an electron field emitter disposed to face the porous semiconductor layer.

Efficient light emission is made possible by forming a conductive layer having a very large area on one surface of the porous semiconductor layer and a transparent conductive film having a very small area on the other surface thereof. It is believed that this efficient light emission results from the concentration of an electric field on the transparent conductive film side.

By injecting electrons from the electron field emitter into the porous semiconductor layer, light emission from the porous semiconductor layer can be produced.

According to a further aspect of the present invention, there is provided a method of manufacturing a Si light emitting device comprising the steps of forming a metal electrode on one surface of a Si layer, performing an anodic oxidation by dipping the Si layer in an aqueous solution of hydrofluoric acid and forming a porous region containing a cluster of Si quantum wires on the surface of the Si layer, forming a $SiO_2$ layer by oxidizing the exposed surface of the Si layer in an oxidizing atmosphere, and depositing a layer having a conductivity type opposite to that of the Si layer on the $SiO_2$ layer above the porous region.

Pure water treatment or thermal oxidization process after the anodic oxidation allows the transition energy of the quantum wires to be controlled.

According to yet another aspect of the present invention, there is provided a method of manufacturing a porous semiconductor device comprising the steps of performing an anodic oxidation of a Si or SiC semiconductor layer in an aqueous solution of hydrofluoric acid to form a porous semiconductor layer, and dipping the porous semiconductor layer in pure water to which ultrasonic waves are applied.

According to another aspect of the present invention, there is provided a method of manufacturing a porous semiconductor light emitting device comprising the steps of performing an anodic oxidation of a Si or SiC semiconductor layer in an aqueous solution of hydrofluoric acid to form a porous semiconductor layer, and exposing the porous semiconductor layer to fluorine gas.

According to a further aspect of the present invention, there is provided a method of manufacturing a porous semiconductor light emitting device comprising the steps of irradiating reactive ions onto the surface of a Si or SiC semiconductor layer, and performing an anodic oxidation of the semiconductor layer in an aqueous solution of hydrofluoric acid to form a porous semiconductor layer.

By dipping the porous semiconductor layer subjected to the anodic oxidation in an aqueous solution of hydrofluoric acid in pure water to which ultrasonic waves are applied, the light emission mechanism of the porous semiconductor layer can be changed efficiently.

By exposing the porous semiconductor layer subjected to the anodic oxidation in a hydrofluoric acid solution to fluorine gas, a good surface and light emission mechanism can be obtained.

By performing the anodic oxidation of the semiconductor layer in a hydrofluoric acid solution after irradiating reactive ions onto the surface thereof, the transformation of the same into a porous state can be enhanced without applying ultraviolet rays. It is believed that this comes about as a result of the fine irregularities on the surface of the semiconductor layer generated by the ion irradiation.

BRIEF DESCRIPTION OF THE DRAWINGS

FIG. 9 is a table explaining the properties of porous semiconductor layers of various samples.

FIG. 17A is a cross-section, and FIG. 17B is a plan view.

DETAILED DESCRIPTION OF THE PREFERRED EMBODIMENTS

Figure 1A:
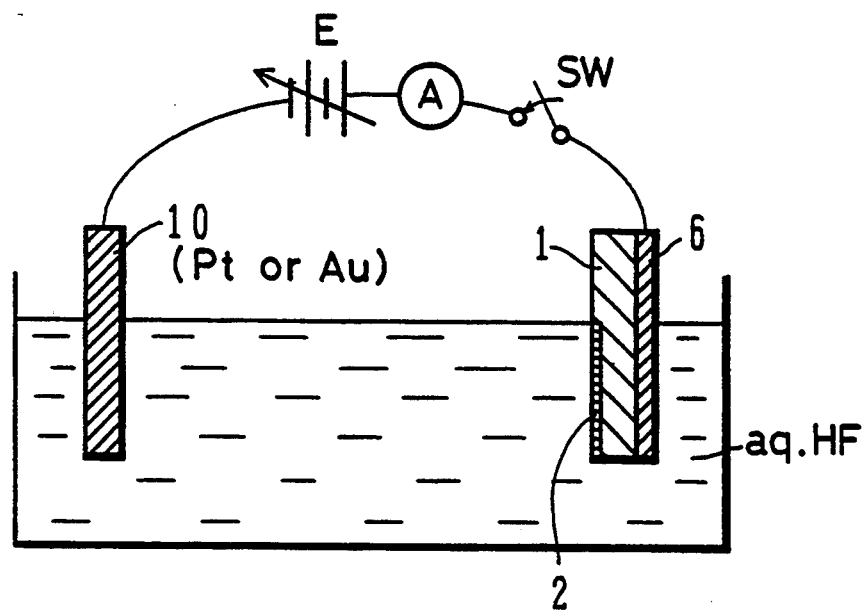
FIGS. 1A and 1B are schematic cross-sectional views explaining the anodic oxidization process according to an embodiment of the present invention.

As shown in FIG. 1A, on the back surface of a p-type Si wafer 1 having the (100) surface and a resistivity of 10 $\Omega$cm, a metal electrode 6 is formed by vapor-deposition of Au. Al may be deposited in place of Au. The wafer 1 and a counter electrode 10 made of Au (Pt may be used instead) are immersed in an aqueous solution of hydrofluoric acid (10 to 48 weight % HF).

The p-type silicon wafer 1 is connected to the positive side of a d.c. power source E and the counter electrode 10 is connected to the negative side thereof, so as to perform an anodic oxidation. Electric power is supplied for a period of time within the range of from 15 seconds to two minutes at a current density within the range of from 20 to 100 mA/Cm². A porous region 2 having a depth of about 1 μm is formed on the surface of the p-type Si wafer 1 at the region immersed in the hydrofluoric acid aqueous solution.

Figure 1B:
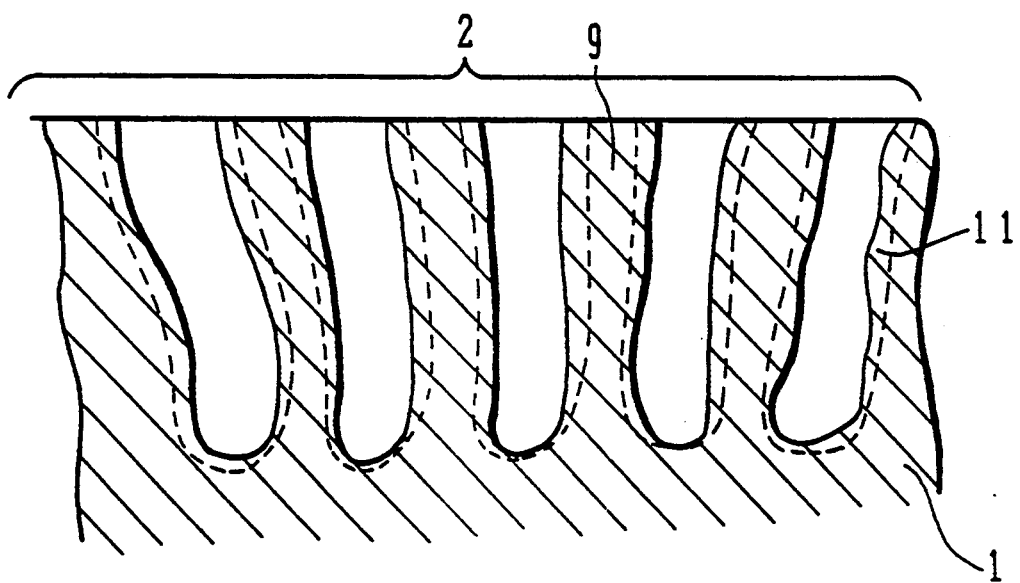

FIG. 1B is an enlarged schematic diagram showing the porous region 2. Although the porosity at the Si wafer surface varies with anodic oxidization conditions, under the above-described conditions a porous state presenting Si fine wires 9 having a diameter in the range of from 40 to 100 angstroms is obtained. The pores or recesses and quantum wires shown in FIG. 1B are in the range of from 40 to 100 angstroms in diameter.

Each etch pit pore is not formed in a direction which is perfectly perpendicular to the (001) surface, but rather the pits are curved irregularly because of bubbles generated during etching and the influence of random change of high electric field points or the like.

Since the Fermi level of Si at the inner wall of the etch pit is being pinned, a depletion layer 11 is formed. The electrical and chemical etching in the HF aqueous solution can not proceed without holes, and thus the etching at the side walls of the etch pit is retarded.

Holes are essential for the formation of the porous region 2 on the Si wafer surface, and the surface orientation and crystal properties are not relevant. It is therefore preferable to perform the anodic oxidation process while light is being applied, if n-type Si is used.

The bottom area of each etch pit has a large radius of curvature and the electric field concentrates at this area. The surface electric field at the bottom areas is therefore cancelled so as to supply holes and enhance the etching. That is to say, the etching at the bottom areas advances mainly in the depth direction. When adjacent etch pits become contiguous, a number of Si wires are formed. The density of etch pits, i.e., the diameter of Si wires, can therefore be controlled by the resistivity of p-type Si. The lower the resistivity, the thicker the Si wire, and the higher the resistivity, the thinner the Si wire. After the porous region 2 is formed so as to have Si quantum wires of a desired diameter, the power is turned off to stop the anodic oxidation process. Next, the specimen is washed in an HF aqueous solution, then washed in water for a sufficient time, and dried. Under these conditions, it is hypothesized that the Si surface at this point is terminated wit hydrogen.

Next, the specimen was placed in a reaction furnace (not shown) and retained for about 30 minutes at a temperature in the range of from 800° to 900° C. under a dry oxygen atmosphere at a pressure of several Torr. It is hypothesized that at this point the hydrogen on the Si surface has ben replaced by oxygen and that the shallow Si surface is oxidized. A SiO₂ layer having a thickness in the range of from 20 to 50 angstroms is formed on the surface of the Si wafer including the porous region. The diameters of the Si wires is thus reduced because of the replacement of the surface Si by an oxide film. It is therefore unnecessary to reduce the thickness of the Si wires to an objective diameter at the anodic oxidation stage of the process. Positive use of such an oxide film results in a reinforced mechanical structure for the quantum wires.

Figure 2A:
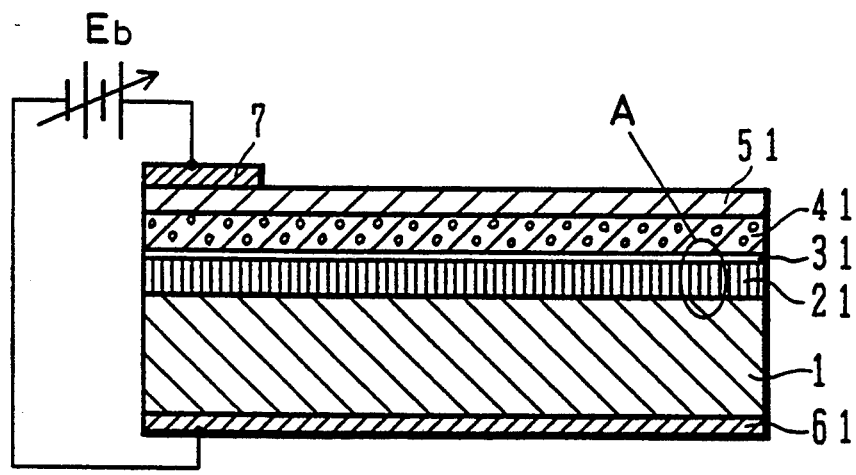
FIGS. 2A and 2B are schematic cross-sectional views showing the structure of a Si light emitting device according to an embodiment of the present invention.

The structure of a Si light emitting device shown schematically in FIGS. 2A and 2B will be described next. In FIG. 2A, reference numeral 21 indicates a Si porous region, and reference numeral 31 indicates a SiO₂ film formed on the surface of the Si porous region 21. An electrode 61 is formed on the bottom surface of the p-type Si wafer.

The specimen of FIG. 2A is placed in a CVD apparatus. An n-type SiC layer 41 about 3000 angstroms in thickness is deposited on the SiO₂ film 31 by plasma chemical vapor deposition (CVD) while SiH₄, C₃H₈ and H₂ are introduced into the CVD apparatus. Instead of the n-type SiC layer, an n-type polycrystalline Si layer about 500 angstroms in thickness may be deposited by plasma CVD SiH₄ and H₂ are introduced into the apparatus. In the latter case, by doping the layer with phosphorus (arsenic may be used instead), an n-type polycrystalline Si layer 41 having a carrier concentration n of about $10^{18}$cm$^{-3}$ is obtained. An enlarged view of the specimen formed in the foregoing manner is shown in FIG. 2B.

An ITO (idium-tinoxide) film 51, from which light can be emitted, is deposited on the surface of the n-type SiC layer 41 by means of sputtering alternative processes may also be used. An electrode 7 made of Au (Al may be used instead) is locally formed on the surface of the ITO film 51. The specimen is cut to a predetermined size, and the same is electrically connected between the electrodes 7 and 61 to thus obtain the Si light emitting device shown in FIG. 2A.

When the Si light emitting device is biased in the opposite direction using a d.c. power source Eb as shown in FIG. 2A, the avalanche breakdown occurs at a potential of about 20 V within the quantum wire cluster in the p-type Si wafer to thereby generate electron-hole pairs.

The ionization factor (multiplication factor) of electron-hole pairs is about $10^3$ with an electric field of $3*10^5$ V/cm and about $10^4$ with an electric field $4.5*10^5$ V/cm. Visible light is radiated from the quantum wires through recombination. Light passes through the n-type SiC layer 41 having an inhibited band width of 2.2 eV and radiates into the air.

Figure 3:
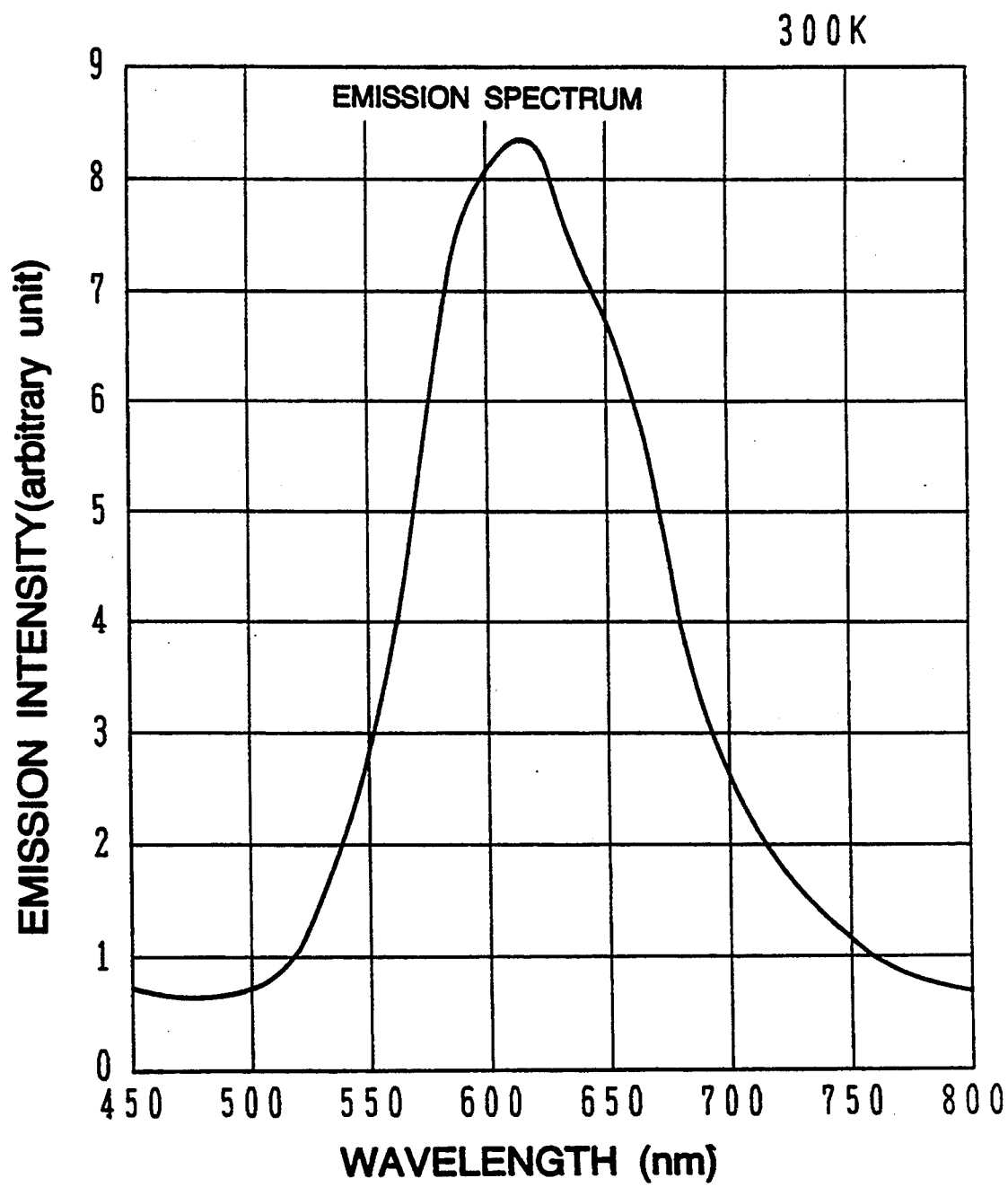
FIG. 3 is a graphical diagram showing the light emission spectrum of the Si light emitting device.

The wavelength of emitted light depends on the diameter of the quantum wires. Light in the visible range having a wavelength of from 580 to 800 nm is obtained. The emitted light data is set forth in FIG. 3 which shows a peak wavelength of about 610 nm.

Figure 4:
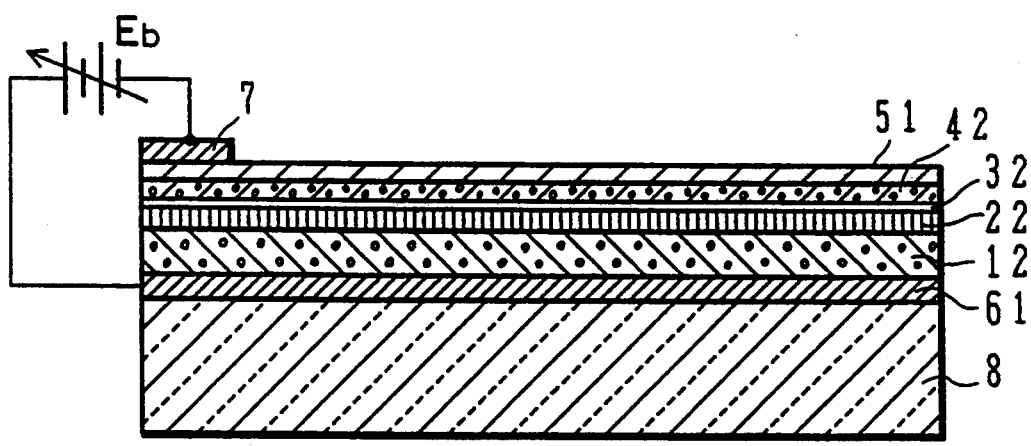
FIG. 4 is a cross-sectional elevational view showing the structure of the Si light emitting device according to another embodiment of the invention.

FIG. 4 shows a Si light emitting device with a thin polycrystalline Si deposited layer according to another embodiment of the present invention.

On a quartz substrate 8, Au was vapor deposited to form a back metal layer 61 on which a p-type polycrystalline Si layer 12 having a carrier concentration of $7*10^{17}$cm$^{-3}$ was deposited to a thickness of 3 μm by means of low pressure CVD. This specimen was subjected to anodic oxidation as described in connection with FIG. 1A to form a porous region 22 having a thickness of about 1000 angstroms on the upper surface of the p-type polycrystalline Si layer 12.

The surface of the porous region 22 was subjected to dry thermal oxidation to form a SiO₂ film 32 having a thickness of about 30 to 40 angstroms thereon. The specimen was washed using an HF aqueous solution and water and dried. Although the Si layer of the porous region 22 originally was terminated with hydrogen, it is hypothesized that the hydrogen was replaced by oxygen during the process of dry thermal oxidation to form a SiO₂ film.

The diameter of a Si quantum wire becomes smaller, the thinner the SiO₂ film. It is therefore possible to set the diameter of the Si quantum wire at about two times to three times the objective diameter during the anodic oxidation process in an HF aqueous solution, thus maintaining the mechanical strength of the quantum wire cluster at a high value. The thickness of the $SiO_2$ is then controlled so as to allow electrons to tunnel therethrough.

An n-type polycrystalline Si layer 42 in deposited on $SiO_2$ film 32 a thickness of about 500 angstroms by low pressure CVD. The carrier concentration of this layer was set at about $5*10^{18} cm^{-3}$. An ITO film 51 was deposited on the polycrystalline Si layer 42, and an ITO electrode 7 was formed at the peripheral area of the ITO film 51.

A d.c. power source Eb was connected between the electrodes 7 and 61 to forward bias the Si pin junction. When a forward bias voltage in the range of 3 to 5 V was applied, electrons in the n-type polycrystalline Si layer 42 tunnelled through the $SiO_2$ film 32, were injected into quantum wires of the porous region 22, and passed over the depletion layer potential at the surface area of the quantum wires to reach the innermost area thereof. Electrons recombined with holes within the quantum wires, and visible light was radiated.

The Si light emitting device of this embodiment is formed on a quartz substrate. The embodiment of FIG. 4 is therefore more suitable for a large area display device than the embodiment shown in FIGS. 2A and 2B. Instead of the quartz substrate, other insulating substrates may be used, and the polycrystalline Si upper layer 42 may be replaced with a SiC layer or the like having a broader band gap. The polycrystalline Si lower layer 12 may be made to be porous to radiate light from the bottom surface of the device through transparent bottom electrode 61.

In the above embodiments, the Si light emitting device was excited by a uni-directional d.c. bias. The Si light emitting device may also be excited by an a.c. power source in principle. In particular, the light emission efficiency can be improved by reverse biasing once to generate an avalanche breakdown and thereafter forward biasing to inject hot electrons. The reason for the improved efficiency is that increased number of holes caused by the avalanche breakdown remain in the innermost areas of the quantum wires.

The diameter of the Si quantum wire in the foregoing embodiments is controlled by thermal oxidization. It was found that the wavelength of light radiated from Si quantum wires can be controlled by treatment with purified water after the anodic oxidation process.

Figures 5A, 5B:
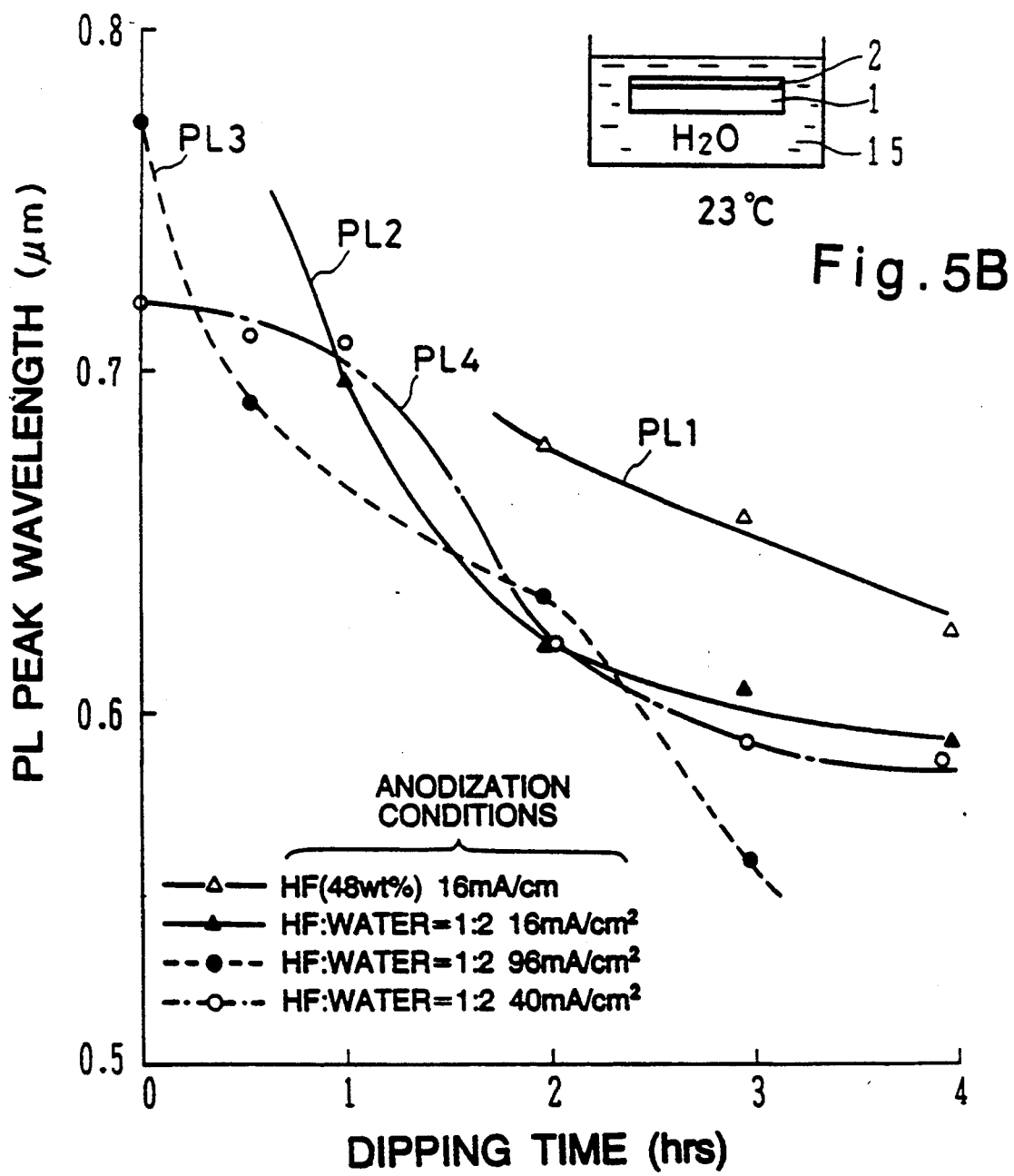
FIG. 5A is a graph showing photoluminescence data representing the effects of pure water treatments and plotted relative to dipping time.
FIG. 5B is a schematic view illustration of a pure water treatment process.

As shown in FIG. 5B, after forming a porous region 2 by anodic oxidation of the Si substrate 1 in an aqueous solution of hydrofluoric acid (alcohol added HF aqueous solution may be used instead), the substrate 1 was dipped in pure water 15 without drying.

P-type Si wafer samples were subjected to anodic oxidation in an HF aqueous solution under various conditions. Thereafter the samples were dipped in ion exchanged pure water. Change in photoluminescence relative to dipping time was measured.

Sample PL1 underwent anodic oxidation for 20 seconds at a current density of 16 $mA/cm^2$ in an HF aqueous solution containing 48 weight % HF. Sample PL2 underwent anodic oxidation for 20 seconds at a current density of 16 $mA/cm^2$ in FIG. 5 an HF aqueous solution containing 36 weight % HF. Sample PL3 underwent anodic oxidization for 20 seconds at a current density of 96 $mA/cm^2$ in an HF aqueous solution containing 36 weight % HF. Sample PL4 underwent anodic oxidation for 20 seconds at a current density 40 $mA/cm^2$ in an HF aqueous solution containing 36 weight % HF.

Following anodic oxidation, the Si wafers were dipped in pure water for preset times and dried. Thereafter, photoluminescence was measured. These processes were conducted at room temperature. A Si porous layer 2 about 1 $\mu$m in thickness was formed on the surface of each Si wafer 1 by the anodic oxidation process.

FIG. 5A is a graph showing the change in photoluminescence peak wavelength relative to the immersion time in pure water, as obtained from the experiments made under the above-described conditions.

Sample PL1 which underwent anodic oxidation in the 48 weight % HF aqueous solution radiated no light immediately after oxidation. After immersion in pure water for two hours, this sample emitted radiated light, and the wavelength of the emitted light gradually shifted to a shorter wavelength of the emitted light gradually shifted to a shorter wavelength as the immersion time in pure water was increased.

Sample PL2 which underwent anodic oxidation in the 36 weight % HF aqueous solution at a current density of 16 $mA/cm^2$ also exhibited no photoluminescence immediately after the oxidation process. After immersion in pure water for one hour this sample exhibited photoluminescence, and the wavelength of the emitted light gradually shifted to a shorter wavelength as the immersion time in pure water was increased. The wavelength of light emitted by sample PL2 was shorter than that emitted by sample PL1.

Sample PL3 which underwent anodic oxidation at a current density of 96 $mA/cm^2$ radiated light immediately after the anodic oxidation process. The wavelength of the light emitted from this sample after immersion in pure water became shorter as the immersion time was increased. The wavelength of the light emitted from sample PL3 changed from about 770 nm to 560 nm during three hours of pure water treatment. A sample immersed in pure water for four hours radiated no light.

Sample PL4 which underwent anodic oxidation at an intermediate current density of 40 $mA/cm^2$ showed photoluminescence immediately after the anodic oxidation process. The wavelength of the light emitted by this sample gradually became shorter as the immersion time in pure water was increased.

It was found from these experiments that the samples which showed no photoluminescence immediately after anodic oxidation exhibited photoluminescence after the pure water treatment, and that the wavelength of the light emitted from the samples which showed photoluminescence shifted was shortened as a result of pure water treatment.

A significant change was realized if the pure water dipping time was at least 30 minutes. When the Si wafers were immersed in pure water after anodic oxidation in an HF aqueous solution, bubbles were generated from the Si surface. It is therefore presumed that some chemical reaction occurs at the Si surface. It is conceivable that the wavelength of emitted light can be controlled by changing the temperature of the pure water. In the foregoing experiments, although photoluminescence was measured after each sample was subjected to the pure water treatment and dried, there is a possibility that photoluminescence might occur in situ if a short wavelength light were to be applied to the porous region while the sample is immersed in pure water. In such case, the pure water treatment may be performed while the emitted light wavelength is monitored in situ, and the treatment may then be stopped when a desired wavelength is observed.

The pure water treatment following the anodic oxidation changes the transition energy of Si quantum wires as described above. This phenomenon may be used in the manufacture of Si light emitting devices.

Figure 6A:
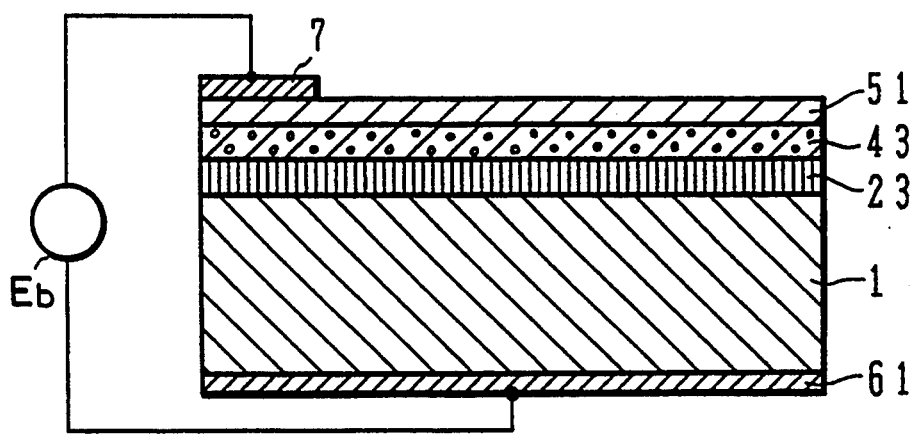
FIGS. 6A and 6B are schematic cross-sectional views of the Si light emitting device according to another embodiment of the present invention.
Figure 6B:
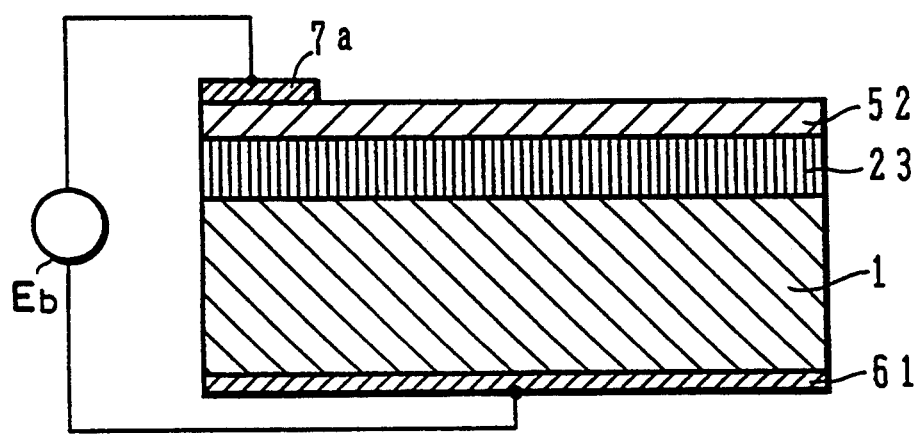

FIGS. 6A and 6B show Si light emitting devices according to another embodiment of the invention. FIG. 6A shows the structure of a pn diode type Si light emitting device. On the surface of a p-type Si wafer 1, a porous region 23 made of a quantum wire cluster was formed. An n-type polycrystalline Si layer 43 was formed on the porous region 23. The n-type polycrystalline Si layer 43 was made of Si (SiC may be used instead). An ITO film 51 serving as a transparent electrode was deposited on the n-type polycrystalline Si layer 43. An ITO electrode 7 was formed on the ITO film 51 at its peripheral area. The ITO electrode 7 was made of a metal such as Au or Al. On the bottom surface of the p-type Si wafer 1, a back electrode 61 made of a metal such as Au or Al was formed. A bias power source Eb was connected between ITO electrode 7 and back electrode 61 of the Si light emitting device shown in FIG. 6A so as to apply a forward bias of about 5 V or a reverse bias of about 20 V to the diode structure. Under such conditions, light was emitted by recombination at the porous region 23, and the emitted light was radiated from the surface of the Si light emitting device.

The Si light emitting device shown in FIG. 6A was manufactured by the following method.

On the bottom surface of a p-type Si wafer having a resistivity in the range of from 10 to 20 Ωcm, a metal such as Au or Al was sputtered and annealed at a temperature of 300° C. to form a back electrode 61.

The resultant wafer was immersed in an HF aqueous solution containing 10 to 50 weight % HF (HF aqueous solution with alcohol added may be used instead) so as to undergo anodic oxidation at a current density of 10 to 70 mA/cm². Typically, the Si wafer was subjected to anodic oxidation for 20 sec. a current density of 40 mA/cm² in a 36 weight % HF aqueous solution to thereby form a porous Si layer 23 having a thickness of about 1 μm.

Without drying the Si wafer after the anodic oxidation, the same was immersed in water purified by ion exchange. An exciting light of short wavelength was applied to the porous layer 23 while it was immersed in the pure water to measure photoluminescence. When the peak wavelength of photoluminescence light reached an optimum level, the Si wafer was removed from the pure water and dried.

The Si wafer was then placed in a low pressure CVD apparatus and an n-type polycrystalline Si layer 43 such as n-type impurity doped polycrystalline Si layer 43 such as n-type impurity doped polycrystalline Si (or polycrystalline SiC) was formed thereon to a thickness of about 100 nm by low pressure CVD.

During the formation of the n-type polycrystalline Si layer 43 by low pressure CVD, the Si wafer was heated to about 600° C., while the pressure was maintained at several Torr. Disilane was employed as a Si source and arsine was employed as the n-type dopant.

To form a polycrystalline SiC film by low pressure CVD, the Si wafer is heated to about 700° C. and the pressure is maintained at several Torr. In this case trichlorosilane is used as the Si source, propane is used as the C source, and phosphine is used as the n-type dopant.

An ITO film 51 serving as a transparent electrode was sputtered on the n-type polycrystalline Si layer 43. An ITO electrode 7 was formed on the ITO film 51 at its peripheral area. The ITO electrode 7 was formed by sputtering Al on the ITO film 51 and patterning the Al film. In this manner, the Si light emitting device shown in FIG. 6A was formed.

A bias power source Eb was connected between ITO electrode 7 and back electrode 61 to apply a forward bias of about 5 V. Current was supplied at a density of about 100 to 300 mA/cm² and visible light was emitted from the porous Si layer 23.

Instead of a forward bias, a reverse bias of about 20 V may be applied between the electrodes. In this case, the avalanche breakdown occurred within the porous Si layer 23 and electric field luminescence was observed.

FIG. 6B illustrates a Si light emitting device having a transparent conductive film 52 formed directly on a porous Si layer 23. On the bottom surface of a p-type Si wafer 1 having a resistivity in the range of from 10 to 20 Ωcm, a back electrode 61 made of Au (or Al) was formed. Thereafter, anodic oxidation and pure water treatment were performed to form a porous Si layer 23 having a desired transition energy. These processes are the same as those discussed above which were used for manufacturing the Si light emitting device of FIG. 6A.

After forming the porous Si layer 23, the Si wafer of FIG. 6B was placed in a magnetron sputtering apparatus to form a transparent conductive film 52 to a thickness of about 100 nm using a transparent sintering target such as ITO or ZnO.

In place of the transparent conductive material such as ITO, a thin metal film capable of allowing light to pass may also be used. In such case, the transparent conductive film 52 may be formed by magnetron sputtering to a thickness of about 10 nm.

A metal electrode made of Al for example, was formed on the transparent conductive film 52 and the same was patterned to form an electrode 7a for the transparent conductive film.

A bias voltage source Eb having a predetermined voltage was connected between the electrode 7a and back electrode 61. Current was supplied through the diode structure and light was emitted from the porous Si layer 23.

These Si light emitting devices may be manufactured using a p-type polycrystalline Si layer deposited on a substrate such as a quartz substrate.

With the above embodiments, the porous Si layer having a desired transition energy can be formed by monitoring it during the pure water process, and Si light emitting devices having desired properties can be manufactured easily. After the anodic oxidation and pure water treatment process, the surface of the device may be thermally oxidized.

With the above embodiments shown in FIGS. 1A to 6B described above, it is possible to obtain visible light emitting devices of Si quantum wires by electrically injecting carriers.

The $SiO_2$ thin film covering the Si quantum wires not only improves the mechanical strength of the quantum wires, but also, the width of the quantum wires may be controlled by controlling the thickness of the $SiO_2$ film. Accordingly the use of the $SiO_2$ film not only improves the chemical stability and mechanical strength, but also controls the wavelength and intensity of emitted light.

Further, the pure water treatment after the anodic oxidation can be used to shift the wavelength of emitted light to blue and improve the photoluminescence.

A change in the wavelength of photoluminescence by the pure water treatment indicates a change in the transition energy of the Si. Infrared absorption of samples was measured to find the causes of the photoluminescence wavelength change by the pure water process.

Of the PL1 samples which underwent anodic oxidation in the 48 weight % HF aqueous solution, the sample immediately after the anodic oxidation, the sample immersed in pure water for one hour, and the sample immersed in pure water for three hours, were used for these measurements. These processes and measurements were preformed at room temperature.

Figure 7:
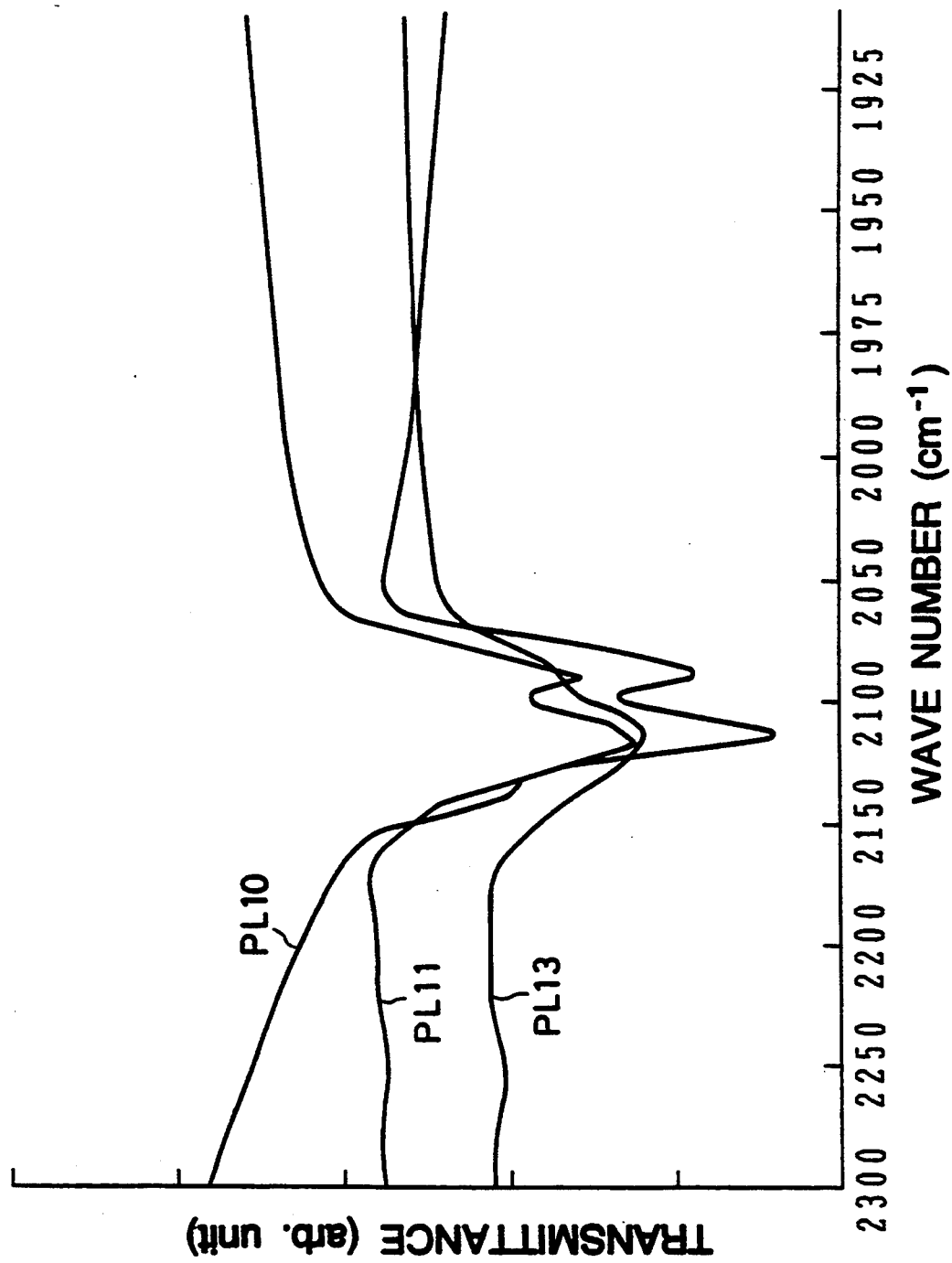
FIG. 7 is a graph showing infrared absorption data explaining the effects of pure water treatments.

FIG. 7 shows the infrared absorption spectra of these samples. The abscissa represents the infrared energy in terms of cm$^{-1}$, and the ordinate represents the transmission factor at an optional scale.

The transmission factor curve of the sample PL10 where measurements were made immediately after anodic oxidation showed three absorption peaks within the range from about 2090 cm$^{-1}$ to 2140 cm$^{-1}$. These absorption peaks can be identified as the stretching oscillation points of SiH, SiH$_2$ and SiH$_3$, respectively. That is to say, the Si surface immediately after anodic oxidation contained SiH, SiH$_2$, and SiH$_3$ bonds.

The transmission factor curve of the sample PL11 which had undergone the pure water treatment for one hour after the anodic oxidation showed a significant reduction of the absorption peak of SiH$_3$ near 2140 cm$^{-1}$. The transmission factor curve of the sample PL13 which had undergone the pure water treatment for three hours also showed a significant reduction of the absorption peak near 2090 cm$^{-1}$.

Specifically, as a result of the pure water treatment, the absorption peak of SiH$_3$ at 2140 cm$^{-1}$ was reduced first, the absorption peak of SiH at 2090 cm$^{-1}$ was reduced next, and the absorption peak of SiH$_2$ at 2120 cm$^{-1}$ remained unchanged.

It can be assumed from these data that there is a possibility of a change in the structure of hydrides terminating the Si quantum wire surface, during the pure water treatment, and also there is a possibility of some relationship between the water treatment and a shift of photoluminescence wavelength toward the blue end of the spectrum.

The surface of the Si quantum wires made porous by the anodic oxidation in an HF aqueous solution can be considered as being terminated with hydrogen. Various types of hydrides are possible and these are assumed from the data shown in FIG. 7 to be SiH, SiH$_2$, and SiH$_3$. The reason why the absorption peaks reduced first for SiH$_2$ and next for SiH$_3$ during water treatment is not still known.

It was found that the photoluminescence mechanism changes as a result of pure water treatment of the porous Si (Si wire) formed by anodic oxidation. How the photoluminescence mechanism changes under different conditions of pure water treatment was investigated. Other processes were also performed as substitutes for the pure water treatment.

FIGS. 8A to 8E are schematic cross-sectional views illustrating how porous semiconductor layers are formed by various processes.

Figure 8A:
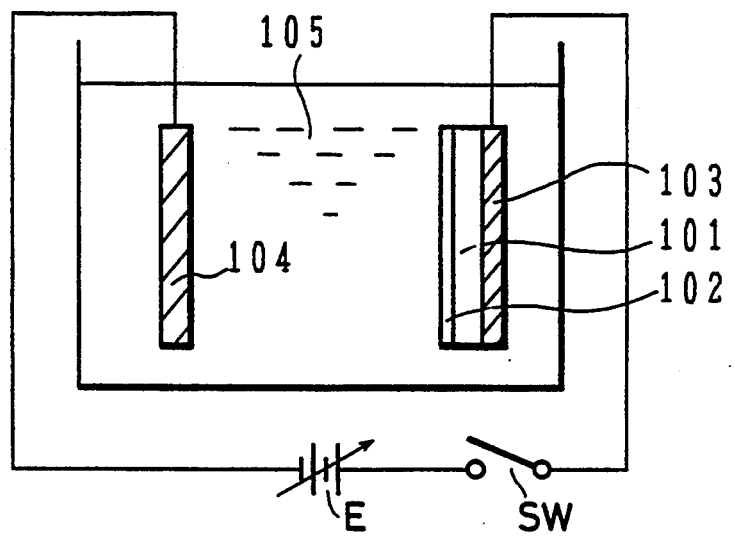
FIGS. 8A to 8E are schematic cross-sectional views explaining how a porous semiconductor layer is formed.

As shown in FIG. 8A, on the bottom surface of a Si substrate 101, a substrate electrode 103 of a material such as Au, Al, or ITO was formed. The Si substrate 101 and a counter electrode 104 formed from a material such as Pt and Au were immersed in an HF aqueous solution 105 to perform the anodic oxidation using the counter electrode as the cathode and the substrate electrode 103 as the anode. These processes are the same as those described above in connection with FIG. 1A.

The Si substrate 101 had a p-type (100) surface and the resistivity of about 10 $\Omega$cm. The HF concentration in the HF aqueous solution 105 should be in the range of from 10 to 50 weight % and preferably may be 48 weight %. A d.c. power source E and switch SW were connected between the counter electrode 104 and substrate electrode 103 produce a current in the range of 20 to 100 A/cm$^2$, and which preferably is 25 mA/cm$^2$, for 20 sec. With these anodic oxidation process parameters, a porous Si layer 102 was formed to a film thickness of about 0.4 $\mu$m. The porous Si layer 102 had a cluster of quantum wires and emitted light.

When the porous Si layer 2 with quantum wires formed by anodic oxidation in the HF aqueous solution was immersed in pure water, the photoluminescence characteristics of the porous Si layer changed.

Figure 8B:
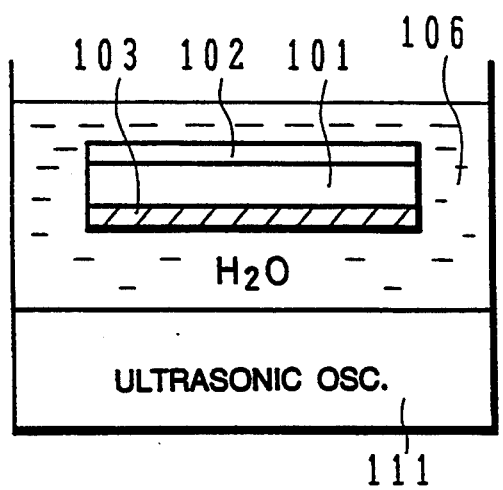
Figure 8C:
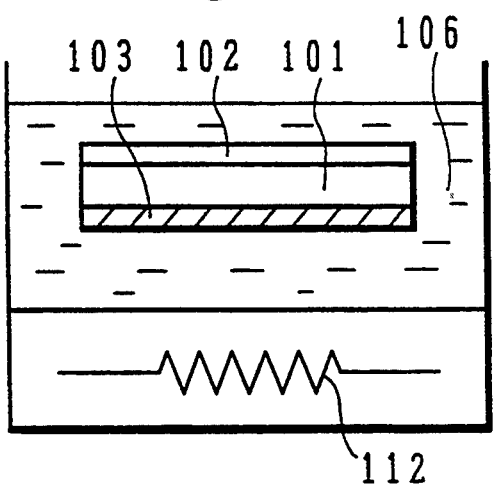

FIGS. 8B and 8C illustrate two modifications of the pure water treatment for the porous Si layer which had undergone anodic oxidation. In FIG. 8B, ultrasonic waves generated from an ultrasonic generator 111 were applied to pure water 106 during the pure water treatment.

When the porous Si layer 102 which had undergone anodic oxidation was immersed in pure water, the reaction proceeded while bubbles were generated at the surface of the porous Si layer. When ultrasonic waves were applied, they thusly generated bubbles quickly separated from the porous Si layer surface 102 to help the reaction proceed in a uniform manner. In order to assist in the separation of bubbles, the porous Si layer 102 was directed upwardly.

In FIG. 8C, pure water 106 was heated by a heater 112. The speed of the reaction between the porous Si layer 102 and the pure water was controlled by controlling the temperature of the pure water.

Figure 8D:
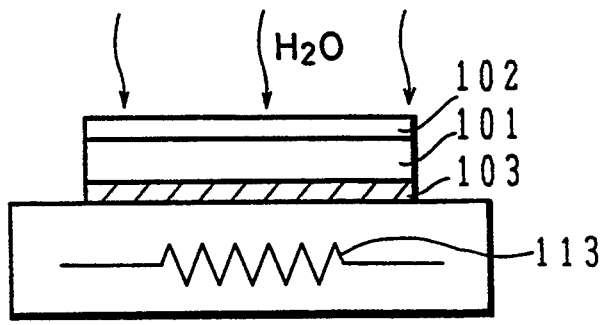
Figure 8E:
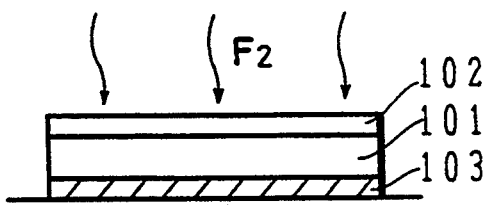

FIGS. 8D and 8E illustrate alternative processes which were substituted for the pure water process. In FIG. 8D, a Si substrate 101 was heated by a heater 113 to oxidize the substrate under a vapor containing atmosphere. The vapor containing atmosphere was selected from among various gasses including vapor containing air, vapor containing oxygen, and the like.

In FIG. 8E a porous Si layer 102 was reacted with fluorine gas. The fluorine gas was a diluted fluorine gas containing 5% F$_2$ and 95% N$_2$.

FIG. 9 is a table showing the experimental results of the pure water treatment and fluorine gas treatment processes. First, sample Si substrates were subjected to anodic oxidation in a 48% HF aqueous solution for 100 sec. at a current density of 25 mA/cm$^2$ to form a porous Si layer about 2 $\mu$m thick.

The porous Si layer of sample S1 was immersed in pure water at 24° C. for 60 minutes while ultrasonic waves were applied. The peak wavelength of photoluminescence was 710 nm. When ultrasonic waves were not applied, it was necessary to combine the pure water treatment for 4 hours in order to obtain the same results under the same conditions.

The porous Si layer of sample S2 was immersed in pure water at 45° C. for 30 minutes while ultrasonic waves were applied. The peak wavelength of photoluminescence was 675 nm. The peak wavelength was thus shorter than sample S1.

The porous Si layer of sample S3 was immersed in pure water at 45° C. for 60 minutes while ultrasonic waves were applied. The peak wavelength of photoluminescence was 620 nm which is shorter than the peak photoluminescence wavelength of sample S2.

The porous Si layer of sample S4 was immersed in pure water at 70° C. for 3 minutes without applying ultrasonic waves. The peak wavelength of photoluminescence was 610 nm.

From these four samples and basing judgement upon the criterion of the PL peak wavelength, it was found that the speed of the pure water treatment increased about four times when ultrasonic waves were applied. It was also found that the reaction speed increased as the temperature of the pure water was raised.

When pure water heated to 70° C. was used without applying ultrasonic waves, the reaction speed increased considerably to decrease the treatment time to as little as three minutes. This reaction time is too short to finely control the pure water treatment. It is therefore preferable to set the pure water temperature at about 45° C. or lower when manufacturing Si light emitting devices.

The reaction during the pure water treatment hardly progressed at all when the pure water temperature was set too low. However, in this case the reaction progressed rapidly when ultrasonic waves were applied. It is preferable to set the pure water temperature at about 20° to 45° C. when ultrasonic waves are used, and at 30° to 40° C. when ultrasonic wavers are not used.

Figure 10:
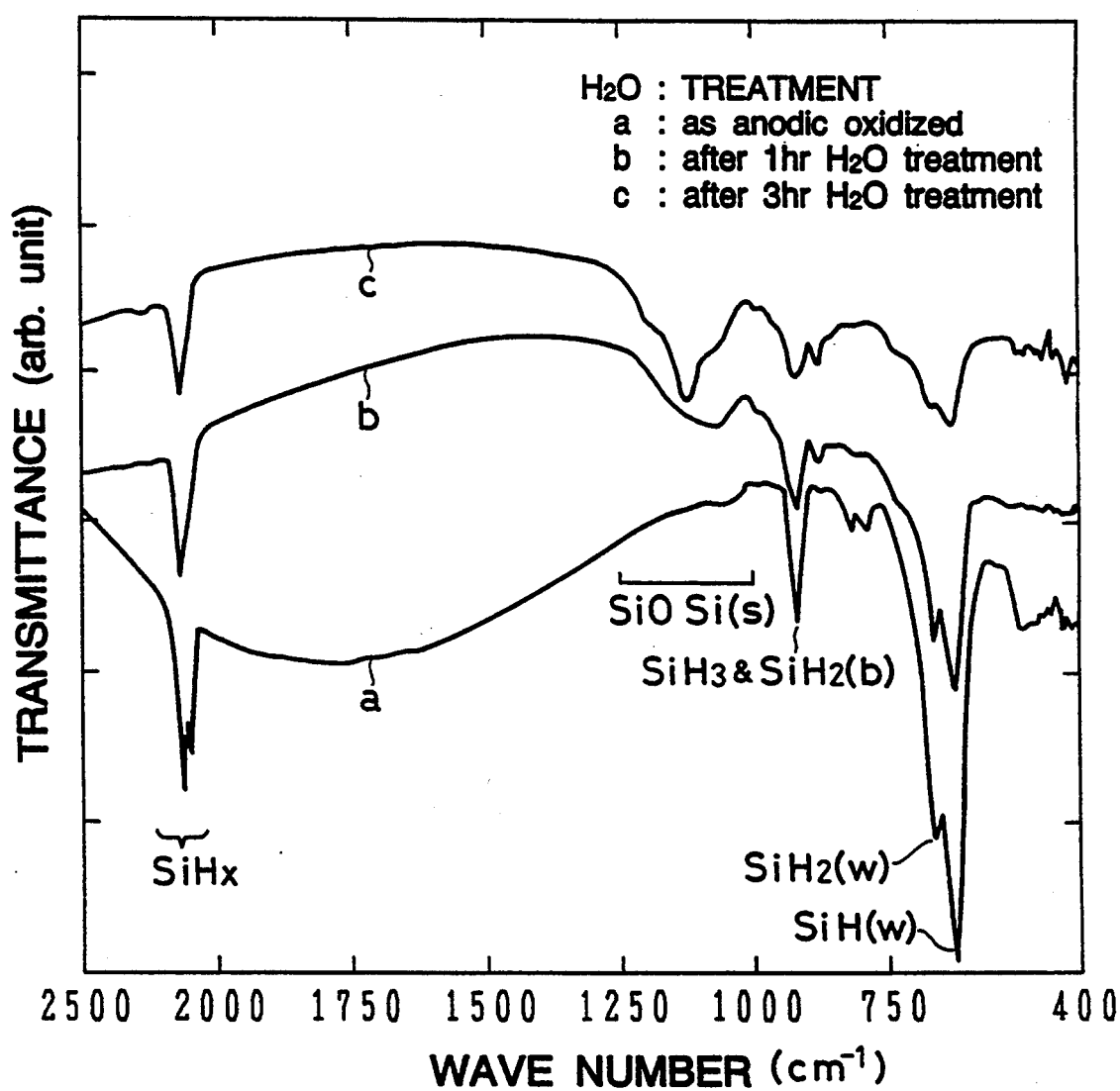
FIG. 10 is an infrared absorption spectrum graph showing the results of pure water treatments.

FIG. 10 shows the changes in infrared absorption by comparing the spectra of samples immediately after anodic oxidation, after 60 minutes of pure water treatment at 24° C., and after three hours of pure water treatment at 24° C. The abscissa represents the wave number $cm^{-1}$, and the ordinate represents the transmission factor at an optional scale. The measurements were conducted within a wavelength range broader than that shown in FIG. 7.

Curve a represents the absorption spectrum of the specimen immediately after the anodic oxidation, curve b represents the absorption spectrum of the specimen after one hour of pure water treatment, and curve c represents the absorption spectrum of the specimen after three hours of pure water treatment.

Absorption in the range from 500 to 750 $cm^{-1}$ and in the range from 2000 to 2200 $cm^{-1}$ may be attributed to the oscillation of SiH, $SiH_2$, and $SiH_x$. Behaviors like those shown in FIG. 7 were found in the range from 2000 to 2200 $cm^{-1}$. Absorption in the range from 900 to 1000 $cm^{-1}$ may be attributed to $SiH_3$ and $SiH_2$. The amount of absorption in these ranges became reduced as the length of the pure water treatment was increased.

Absorption in the range from about 1100 to 1250 $cm^{-1}$ may be attributed to the oscillation of Si—O—Si, and the amount of absorption in this range increased as the length of the pure water treatment was extended. Thus, it is conceivable that the amount of coupling between the Si surface and oxygen O increases as the pure water treatment becomes longer.

The sample for the curve of a of FIG. 10 emitted dim light at wavelengths of 800 nm or longer, the sample for the curve b emitted light at a wavelength of 690 nm, and the sample for the curve c emitted bright light at a wavelength of 630 nm. Thus it is shown that the photoluminescence wavelength becomes shorter as the length of the pure water treatment is increased.

From these experimental data, it can be assumed that the pure water treatment functions to control both the size and the surface conditions of the quantum wires. Since the absorption of Si—O increases as the pure water treatment time is increased, it can also be assumed that light emission of a shorter wavelength becomes more likely to occur as the surface is oxidized.

Returning to FIG. 9, a sample S5 underwent a fluorine gas treatment in place of the pure water treatment. The sample S5 was maintained at 24° C. and the fluorine gas treatment was combined for ten minutes. The wavelength of photoluminescence was 600 nm.

It is conceivable that when fluorine gas comes into contact with Si quantum wires, silicon oxide present on the Si surface is etched to expose a clean Si surface. If such sample is then exposed to air, the clean Si surface may be oxidized immediately to form an oxidized surface. From the view point of producing a shorter wavelength of emitted light, the fluorine gas treatment is effective in the same manner as the pure water treatment.

Figure 11:
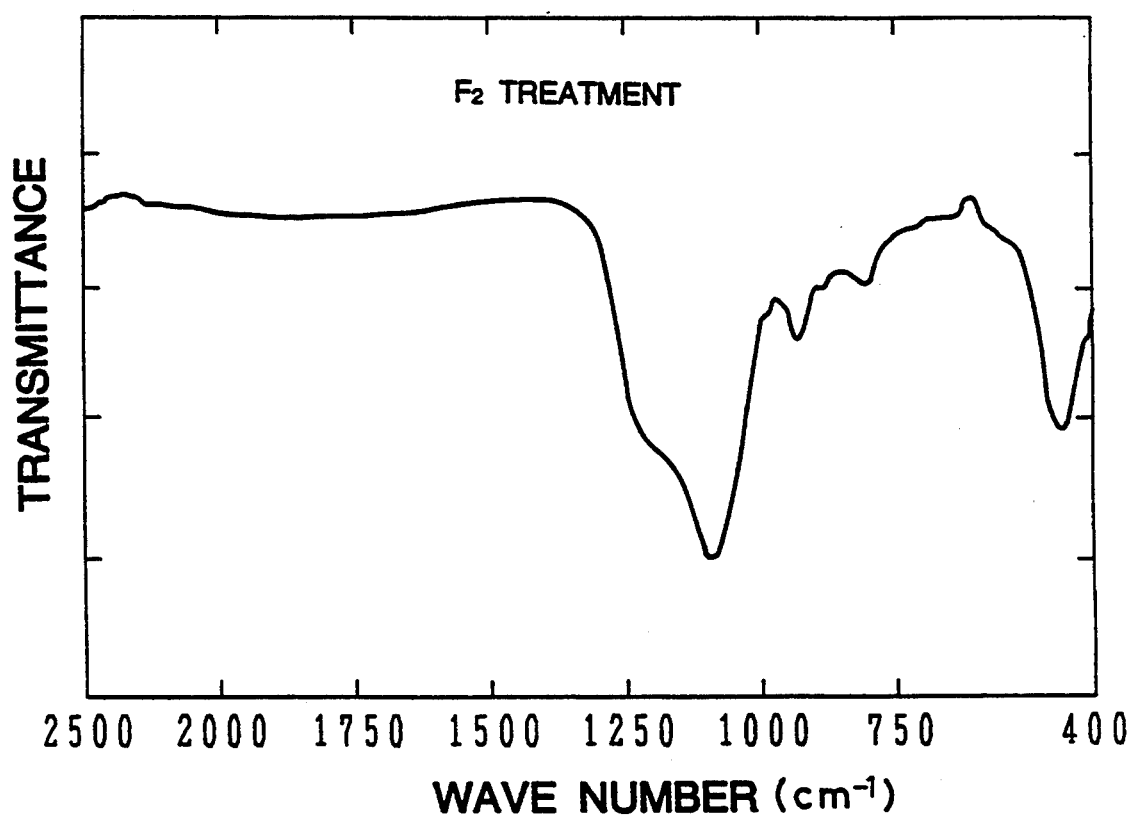
FIG. 11 is an infrared absorption spectrum graph showing the effect of the F2 gas treatment.

FIG. 11 shows the absorption spectrum of a quantum wire which had undergone fluorine gas treatment. The abscissa represents the wave number $cm-1$, and the ordinate represents the transmission factor at an optional scale.

The Si—O absorption observed in the range of from about 1000 to 1250 $cm^{-1}$ the pure water treatment for the samples which had undergone was observed also in connection with the sample which had undergone the fluorine gas treatment. The absorption spectrum of the fluorine treated sample was similar to the spectrum of the thermally oxidized film on silicon.

With the pure water treatment, vapor treatment, or fluorine gas treatment described above, porous semiconductor layers having a suitable photoluminescence mechanism can be manufactured.

Figure 12A:
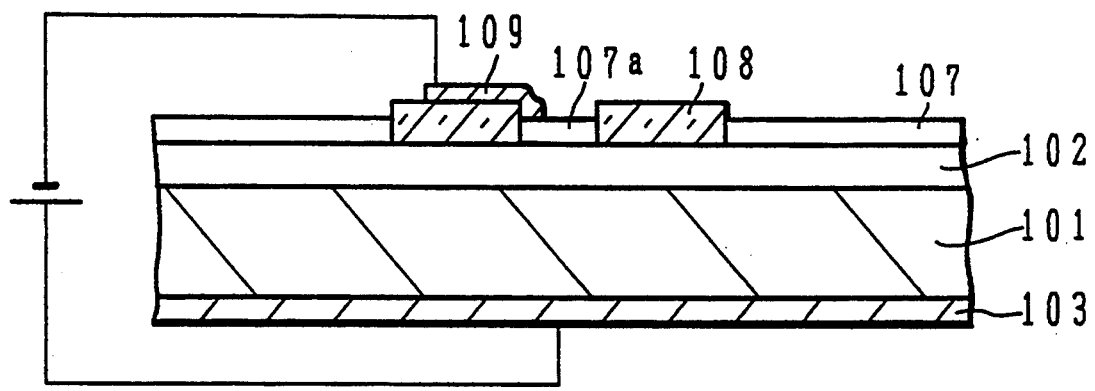
FIGS. 12A and 12B are schematic cross-sectional views showing the structure of a porous semiconductor light emitting device according to an embodiment of the invention.
Figure 12B:
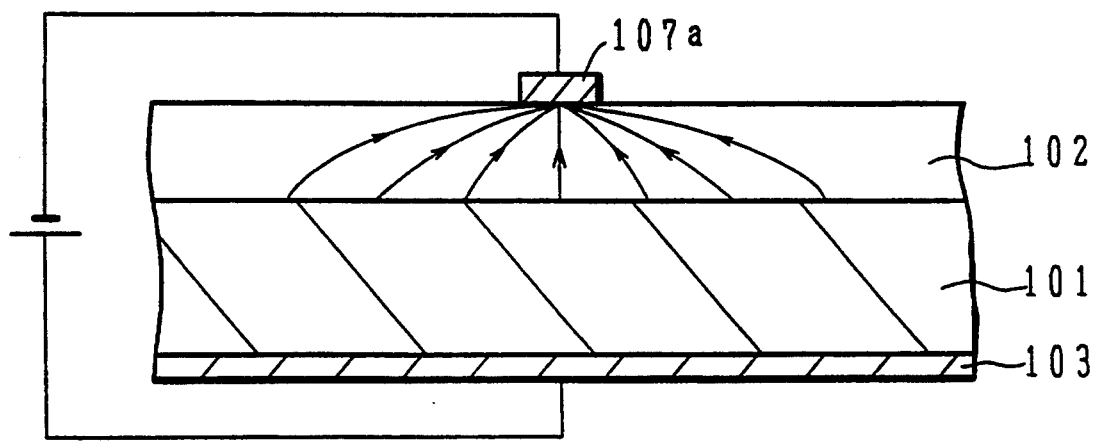

FIGS. 12A and 12B illustrate a porous semiconductor light emitting device. FIG. 12A is a cross-sectional view of the porous semiconductor light emitting device using Si.

On the surface of a p-type Si substrate 101 having a (100) surface and a resistivity of 10 Ωcm, a porous semiconductor layer 102 was formed to a thickness of about 0.4 μm by performing anodic oxidation for 20 seconds at a current density of 25 $mA/cm^2$ in a 48% HF aqueous solution. The porous semiconductor layer 102 was immersed in pure water at 45° C. for about one hour while applying ultrasonic waves.

An n-type ITO (indium-tin oxide) film 107 was sputtered onto the surface of the porous semiconductor layer 102 to a thickness of about 3000 angstroms.

The ITO film 107 was selectively etched leaving a central area 107a which is connected to an electrode, and an insulating film 108 of a material such as $SiO_2$ was formed as shown. An electrode 109 was formed connecting to the central ITO film 107a, and a substrate electrode 103 was formed on the bottom surface of the Si substrate 101. The size of the central ITO film 107a was set so as to be very small as compared to the size of the substrate electrode 103. With an area of 5 to 10 mm square for the substrate electrode 103, the size of the central ITO film 107a is set to about 0.5 mm square.

By limiting the size of the electrode on the photoluminescence surface, light may be emitted efficiently at a relatively low voltage.

FIG. 12B is a schematic diagram showing the distribution of lines of electric force in the semiconductor light emitting device shown in FIG. 12A. Since the size of the upper electrode 107a is considerably smaller than that of the lower electron 103, the lines of electric force from the lower electrode 103 to the upper electrode 107a concentrate near the upper electrode 107a.

The concentration of lines of electric force generates a strong electric field near the upper electrode 107a. As a result, a high electric field is generated at a relatively low voltage allowing light to emit efficiently.

Figure 13B:
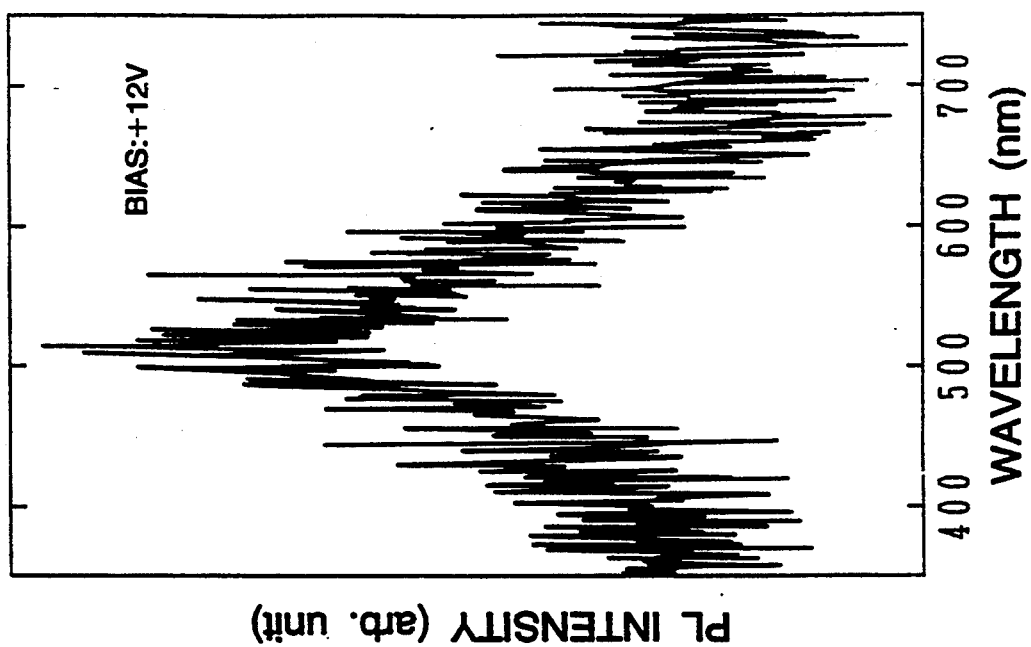
FIGS. 13A and 13B are graphs showing the characteristics of the porous semiconductor light emitting device of FIGS. 12A and 12B.
Figure 13A:
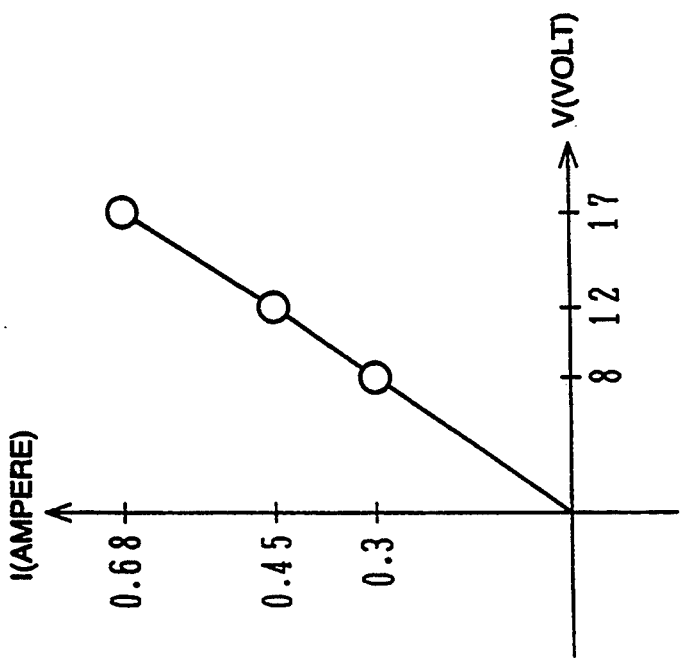

FIGS. 13A and 13B are graphs showing the characteristics of the semiconductor light emitting device shown in FIG. 12A. FIG. 13A shows the I-V characteristics, and FIG. 13B shows the distribution of photoluminescence intensity relative to wavelength.

As shown in FIG. 13A, the semiconductor light emitting device provided the Shottky diode characteristic wherein current increases linearly with an increase in forward voltage. A current of about 0.3 occurred at a forward voltage of 8 V, and a current of about 0.68 A occurred at a forward voltage of 17 V.

FIG. 13B shows the distribution of photoluminescence intensity when a forward bias of 12 V was applied to the semiconductor light emitting device. The peak wavelength of photoluminescence was about 510 nm which is difficult to obtain using a conventional Si light emitting device.

Figure 14:
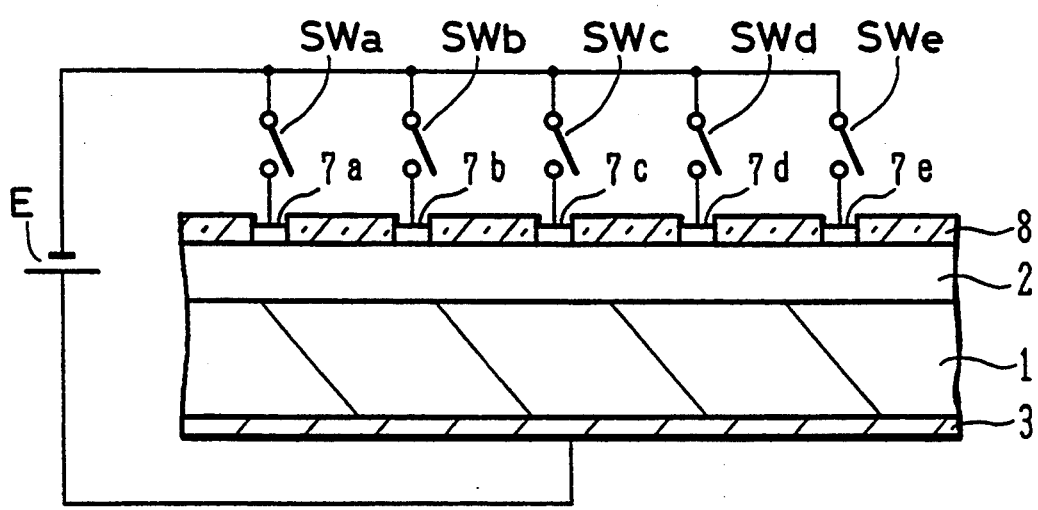
FIG. 14 is a schematic cross-sectional view showing the structure of a porous semiconductor light emitting device according to another embodiment of the invention.

FIG. 14 is a cross-sectional view schematically showing a porous semiconductor light emitting device according to another embodiment of the present invention. On a Si substrate 1, a porous semiconductor layer 2 was formed. A plurality of ITO electrodes 7a to 7e, each separated by an insulating film 8, were formed on layer 2.

By connecting a d.c. power source E via one of switches SWa to SWe between a corresponding one of the ITO electrodes formed on the porous semiconductor layer 2 and an electrode 3 formed on the bottom surface of the Si substrate 1, light was emitted from near the selected ITO electrode. This device may be used for communications, displays, and the like.

The effects of this embodiment obtained from the electric field concentration have been described for the case of the porous semiconductor layer using Si. The same effects may also be obtained using SiC or the like.

FIGS. 15A to 15D illustrate the main steps of a method of manufacturing a Si semiconductor light emitting device according to another embodiment of the invention.

Figure 15A:
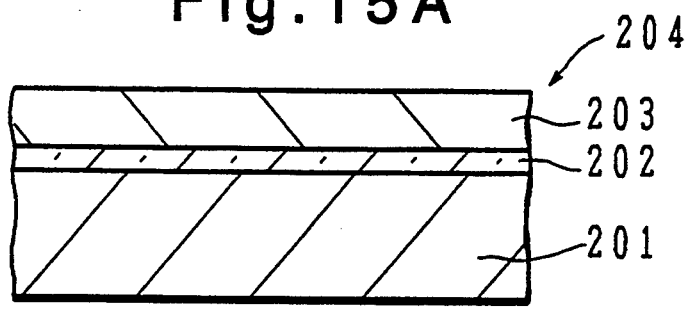
FIGS. 15A to 15D are schematic cross-sectional views showing the main processes of a method of manufacturing a Si light emitting device according to another embodiment of the invention.

As shown in FIG. 15A, an SOI substrate 204 was first prepared by forming, on a Si support substrate 201, a p-type Si layer 203. A SiO2 film 202 is interposed therebetween.

The Si support substrate 201 was a conventional Si wafer having a thickness of from 500 to 700 μm. The SiO2 film 202 was a thermally oxidized film having a thickness of about 1 μm. The p-type Si layer 203 had a thickness of about 2 μm.

An SOI substrate can be manufactured by the following method.

Of two wafers, the surface of at least one wafer is thermally oxidized so as to form a SiO2 film thereon. The two Si wafers are placed one upon the other, and maintained at a high temperature from about 900° to 1000° C. to bond them together.

While maintaining the Si wafers at a high temperature, a voltage or pressure may be applied to the two Si wafers to improve the bonding state. A CVD oxide film may be used for thermally oxidized film. PSG or BPSG may be used to lower the bonding temperature.

After bonding the two Si wafers, it is preferable to polish the Si wafer on which semiconductor elements are to be formed, to a desired thickness. For example, when a Si wafer is bonded to a low impurity concentration epitaxial layer formed on a heavily doped Si wafer, it is possible to etch away only the heavily doped Si substrate and leave the epitaxial layer behind by controlling the etching based upon the difference between impurity concentrations.

Other known techniques such as the chemical etching, mechanical polishing may also be used. The Si support substrate 201 and Si layer 203 both have a (100) surface.

Silicon nitride was deposited on the whole surface of the p-type Si layer 203 and Si support substrate 201. A photoresist film was coated on the silicon nitride film on the Si support substrate 201, an opening having a strip shape (or rectangle shape) was formed in the photoresist film at a predetermined area. Using the remaining photoresist film as a mask, a strip shaped opening was formed in the silicon nitride film.

The SOI substrate was then immersed in a KOH aqueous solution to form an opening 205 in the Si support substrate 201 by means of anisotropic etching. The etching speed in the KOH aqueous solution is great in the <100> orientation. The etching was performed until the SiO2 film 202 was exposed.

Next, the SOI substrate 204 was dipped in an HF aqueous solution to etch out the silicon nitride film on the surface and the exposed SiO2 film 202. The p-type Si layer 203 was therefore exposed at the opening 205.

Figure 15B:
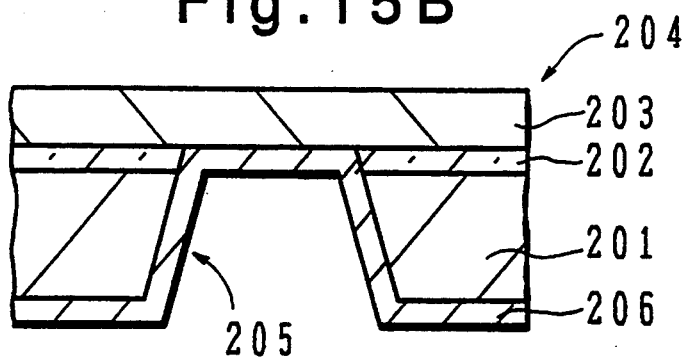

Next, Au was sputtered from the bottom surface side of the Si support substrate 201 to form a back contact electrode 206 on the surface including the opening 205. This state is shown in FIG. 15B. The width of the strip area contacting the back contact electrode 206 to the p-type Si layer was set at about 1 μm using the mask.

Anodic oxidation in an HF aqueous solution was then performed by connecting the anode side of a d.c. power source to the back contact electrode 206 and the cathode side to an electrode such as Pt and Au. Specifically, the SOI substrate 204 was dipped in a 40% HF aqueous solution and the anode oxidation was performed at a current density in the range of from 20 to 100 mA/cm$^2$ to etch the surface of the p-type Si layer 203 opposite to the back contact electrode 206.

When recesses or pores were formed on the surface, the etching was selectively performed at the recesses to form a number of pores on the surface of the p-type layer 203. When adjacent pores became contiguous, the remaining Si region became a cluster of wires. The anodic oxidation was terminated when wires were produced having a diameter in the range of from 5 to 10 nm and a length of about 1.5 μm.

Figure 15C:
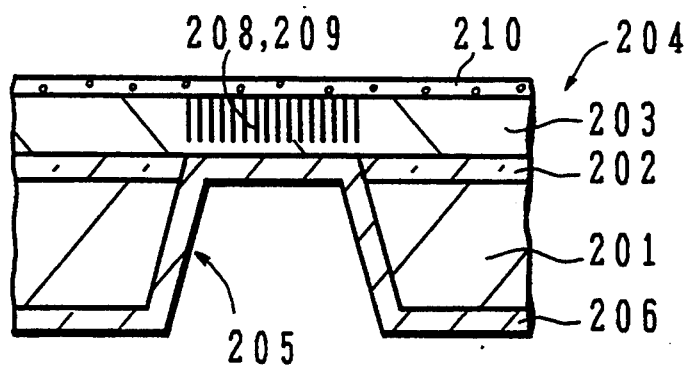
Figure 16:
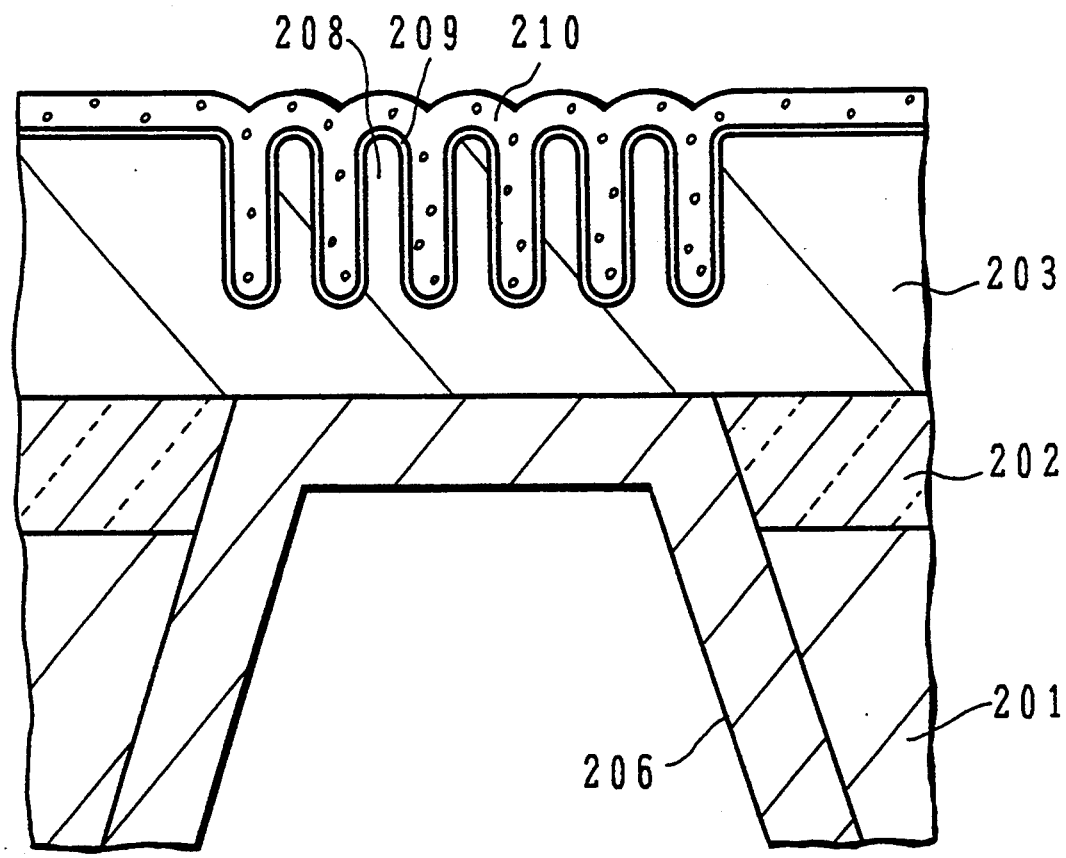
FIG. 16 is an enlarged schematic cross-sectional view showing part of the structure shown in FIG. 15C.

In this manner, a porous Si region 208 was formed on the surface of the p-type Si layer 203. The anodic oxidation may be performed to the middle of the p-type Si layer or to the SiO2 film 202, as illustrated in FIG. 15C. FIG. 16 is an enlarged schematic diagram showing part of the porous Si region 208.

Next, the SOI substrate 204 was washed and dried and thereafter subjected to dry oxidation in an O$_2$ atmosphere to form a Si oxidized film 209 on the surface to about 2 to 5 nm, as shown in FIG. 16.

Next, the SOI substrate 204 was placed within a low pressure CVD apparatus in which Si and H$_2$ containing gases such as SiH4 and Si2H6 were introduced to deposit amorphous (or polycrystalline Si) in the pores between Si wires and on the Si oxide film 209 to form a CVD Si layer 210.

The pores in the porous Si region were filled at least partially by the CVD Si layer 10 so that the physical strength of the porous region was increased. Instead of the CVD Si layer, a CVD SiC layer may be used.

FIGS. 15C and FIG. 16 show the CVD Si layer (or CVD SiC layer) 210 formed on the surface of the p-type Si layer 203. In FIG. 15C, the Si oxide film 209 is omitted.

The Si oxide film 209 was formed on the whole surface of the p-type Si layer 203, on the surface of, which including the pores between Si wires, the CVD Si layer (or CVD SiC layer) 210 was deposited. In FIG. 16, the pores between Si wires are shown completely filled by the CVD Si layer (or CVD SiC layer) 210. The CVD Si layer (or CVD SiC layer) 210 may alternatively only partially fill the pores between Si wires.

Figure 15D:
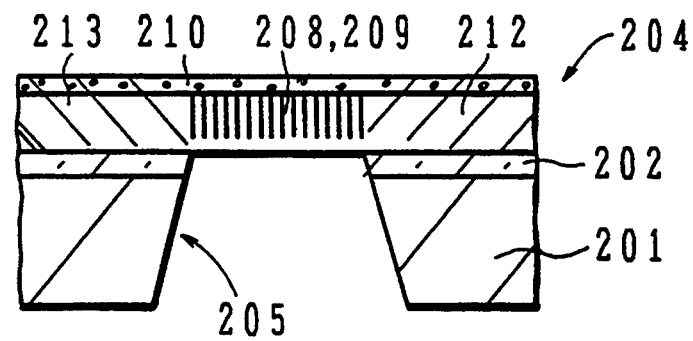

Next, as shown in FIG. 15D, impurity ions were selectively injected into the side areas of the porous Si region 208 to form an n-type region 212 and a p-type region 213. Thereafter, the back contact electrode 206 was removed. In this was, the Si pin diode structure having a photoluminescence mechanism was manufactured.

Figure 17A:
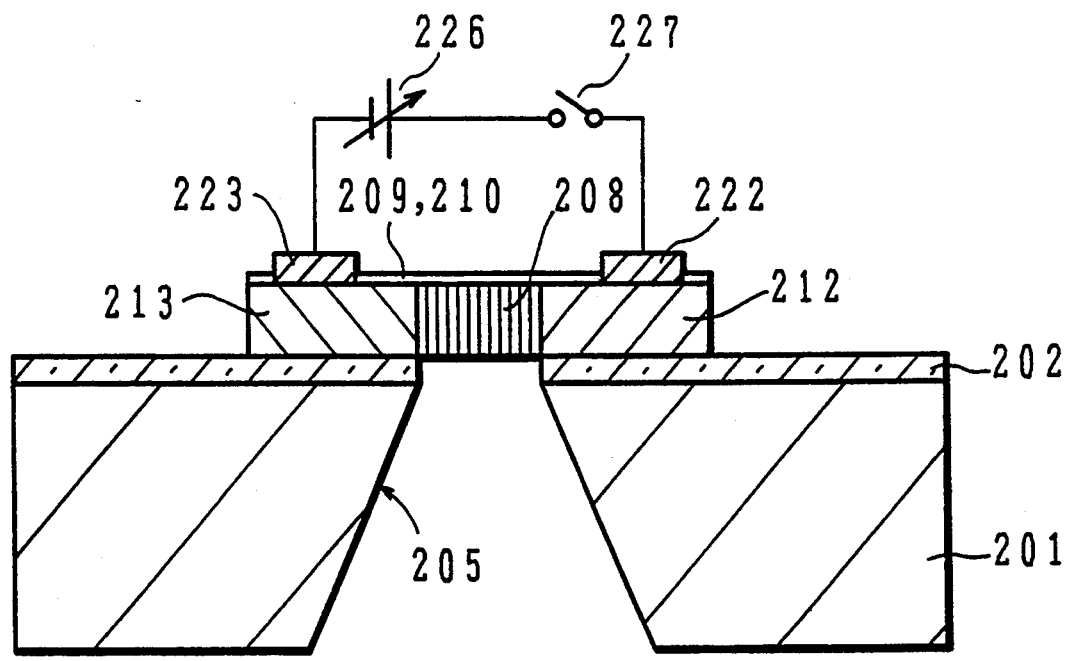
FIGS. 17A and 17B are schematic diagrams showing a Si light emitting device according to an embodiment of the invention.
Figure 17B:
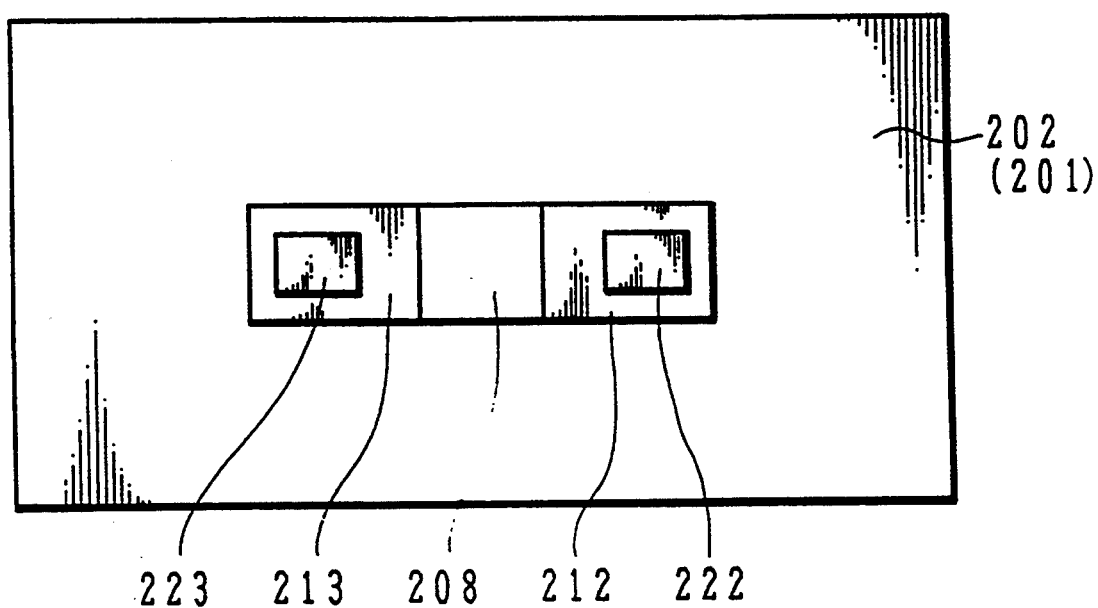

FIGS. 17A and 17B show the structure of a Si light emitting device manufactured by the above-described method. FIG. 17A is a cross-sectional view, and FIG. 17B is a plan view.

Similar to the SOI substrate 204 shown in FIG. 15D, an n-type Si region 212 and a p-type Si region 213 are formed on n Si support substrate 201 with an opening 205. A SiO2 film 202 is interposed between the Si support substrate and the two regions 212 and 213. A porous Si region 208 is formed between regions 212 and 213.

On the surface of these regions including the Si layer 208 and regions 212 and 213, there is formed a Si oxide film 209 and a CVD Si layer or CVD SiC layer 210. Contact holes are formed in the n-type and p-type regions 212 and 213 at predetermined positions where an n-side electrode 222 and p-side electrode 223 are formed. A reverse bias d.c. power source 226 and a switch 227 are connected between the n-side and p-side electrode 222 and 223.

As shown in the plan view of FIG. 17B, the Si layer surrounding the diode structure is removed to electrically isolate the diode structure. In FIGS. 17A and 17B, one diode structure is shown formed on the support substrate 201. Alternatively, desired number of diode structures may be formed on the support substrate 201. In the latter case, a number of porous Si wire regions 208 surrounded by the Si oxide film between n-type regions 212 and p-type regions 213 are distributed on the Si support substrate, each diode structure forming a pin or pen diode.

When a reverse bias voltage is applied to such a diode, the applied voltage is concentrated mainly on the porous Si region 208 of a high resistivity region. If the electric field is sufficiently high, avalanche breakdown occurs in the porous Si region 208 to generate a number of electron-hole pairs. Photoluminescence may also be observed by applying a forward bias.

When electron-hole pairs recombine within Si wires, photoluminescence occurs in accordance with the size and surface state of the Si wire. The quantum effect may also be obtained from the oxide film and depletion layer without causing the Si wires to be too thin.

Figure 18A:
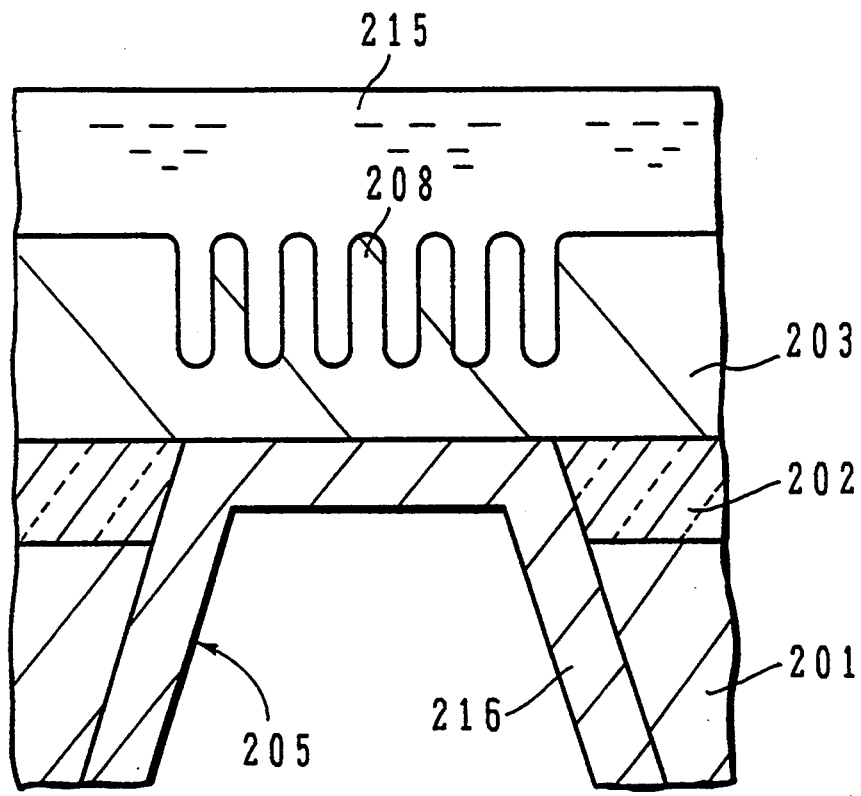
FIGS. 18A and 18B are schematic cross-sectional views illustrating the main processes of a method of manufacturing a Si light emitting device according to another embodiment of the invention.
Figure 18B:
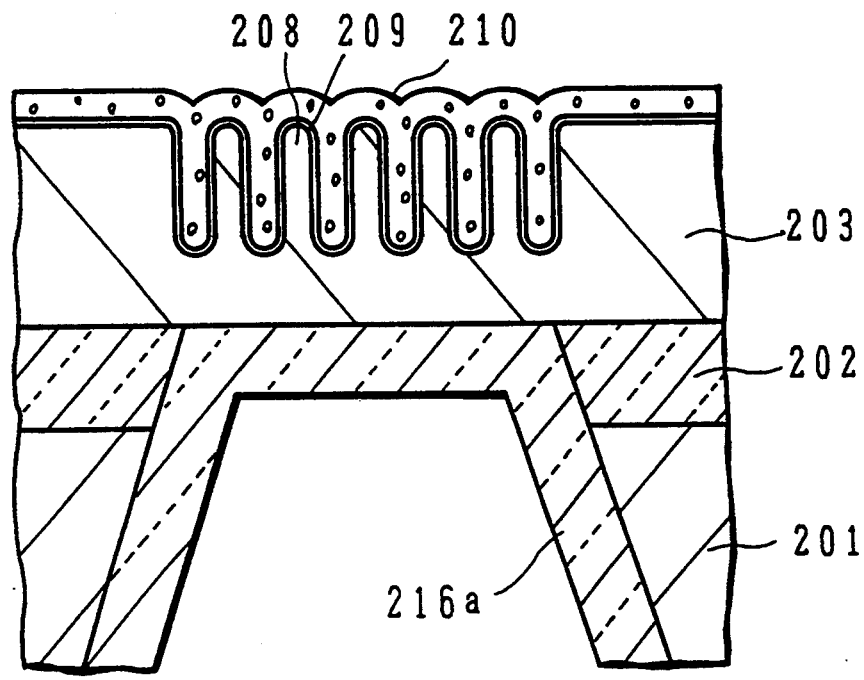

FIGS. 18A and 18B illustrate the main steps of a method of manufacturing a Si light emitting device according to another embodiment of the invention. Similar to the above-described embodiment, an opening 205 was formed in a Si support substrate 201. A back contact electrode 215 of Al, which is easy to oxidize, was formed so as to cover the opening 216.

Thereafter, anodic oxidation was performed by contacting the surface of a p-type Si layer 203 with an HF aqueous solution 215 while protecting the Al back contact electrode 216 from the solution. As a result of the anodic oxidation, the surface of the p-type Si layer 203 facing the region contacting the Al back contact electrode 216 was formed into a porous Si region 208. In this embodiment, the anodic oxidation was terminated before the pores in the porous Si region 208 extended through the full depth of the p-type Si layer 203.

Thereafter, as shown in FIG. 18B, the surface of the p-type Si layer 203 was oxidized, and the Al back contact electrode 216, which was formed on the surface at the opening of the support substrate 201, was oxidized to transform it into an alumina layer 216a. The alumina layer 216a was formed so as to contact the p-type Si layer 203 at least at the area of the opening.

Similarly to the above-described embodiment of FIGS. 15A to 15D, on the surface of the p-type Si layer 203 formed with a Si layer (or CVD SiC layer) 210 was deposited to fill the pores of the porous Si region 208. With this structure, it is not necessary to remove the back contact electrode since it was transformed into the alumina layer 216a.

A metal electrode may be formed on the alumina layer 216a for use as a control electrode. After forming the p-type Si layer 203 by the anodic oxidation, the diode structure may be formed without forming the Si oxide film 209 or CVD Si film (or CVD SiC film) 210. Also in this case, photoluminescence may be obtained from the porous region 208.

In the above embodiment, the SOI substrate has the SiO2 film on which the Si layer is formed. The SOI substrate of other structures may also be used if the Si layer is formed on an insulating film. As the n-type and p-type regions, conductive material other than Si based material may also be used.

As described above, with the embodiments shown in FIGS. 15A to 17B, a Si diode structure having a photoluminescence mechanism can be formed on the support substrate in the lateral direction. It is therefore easy to form a number of laterally disposed, electrically isolated Si light emitting diodes on the same support substrate.

FIGS. 19A to 19D, are cross-sectional views showing the main steps of a method of manufacturing an Si light emitting device according to another embodiment of the invention.

Figure 19A:
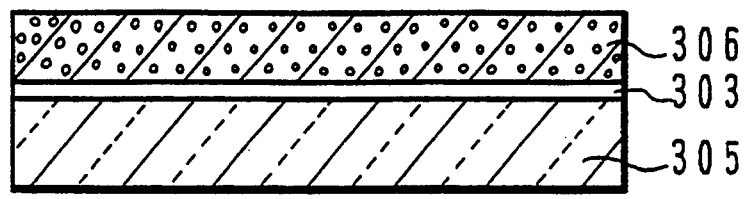
FIGS. 19A to 19D are schematic cross-sectional views illustrating the main processes of a method of manufacturing a Si light emitting device according to another embodiment of the invention.

As shown in FIG. 19A on one face of an insulating substrate 305 made of transparent quartz, an ITO film (or very thin metal film) was formed as an electrode 303 for a Si layer. A B-doped p-type polycrystalline Si layer 306 was deposited on the electrode 303.

The p-type polycrystalline Si layer 306 had a carrier concentration of $7*10^{17}$ cm$^{-3}$ and the same was formed to a thickness in the range of from several hundred nm to several μm by plasma CVD using a hydrogen diluted silane gas as the Si source and diborane as the p-type dopant.

Figure 20A:
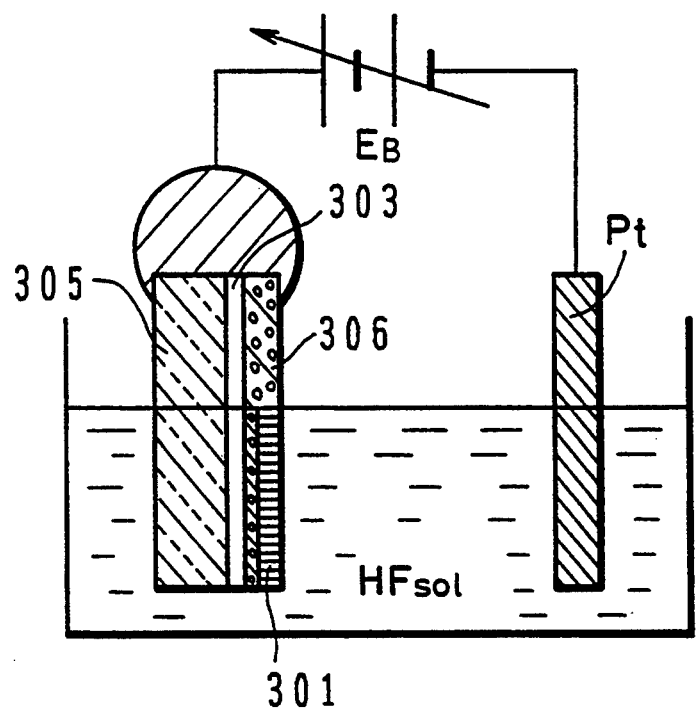
FIGS. 20A and 20B are schematic cross-sectional views illustrating a method of forming a porous Si layer and showing the structure of the porous region.

Next, as shown in FIG. 20A, the polycrystalline layer 306 was immersed in an HF aqueous solution (10 to 48 weight %). The anode of a d.c. bias source Eb was connected to the polycrystalline layer 306, and the cathode was connected to a counter reference electrode made, for example, of a material such as Pt.

A direct current in the range of from 10 to 70 mA/cm$^2$ was used to perform the anodic oxidation to thereby form a porous Si region 301 on the polycrystalline layer 306.

Once pores are formed on the surface of the polycrystalline Si layer, the electric field becomes concentrated at the curved surface so that the anodic oxidation proceeds preferentially in the depth direction. As time goes by, the pores are enlarged in the depth direction without increasing the diameter of each pore.

Holes are necessary for the anodic oxidation reaction. The electric field is weak at the side wall of each pore since the side walls are flatter than the bottom walls of the pores. Therefore, a depletion layer exists on the side wall surface, providing less holes. Holes have a small radius of curvature and are generated preferentially at the bottom walls of the pores. As a result, anodic oxidation progresses preferentially in the depth direction and the oxidized film is dissolved immediately in the HF aqueous solution.

Figure 20B:
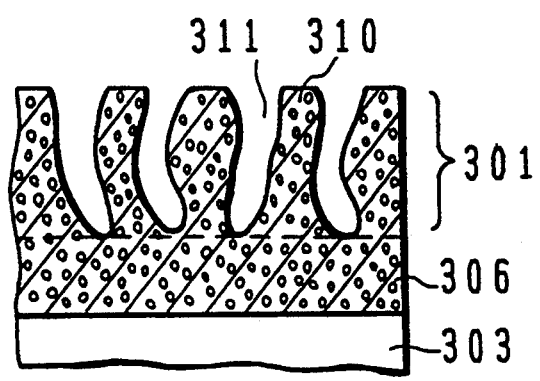

Pores are not always formed perfectly in the depth direction because of bubbles generated during etching or by other causes. Rather pores are formed while curving in the depth direction as shown in FIG. 20B.

The diameter of each pore is therefore determined not only by the etching time but also by the density of the HF aqueous solution and temperature. When the porosity exceeds 50%, Si quantum wires 310 separated by pores 311 as shown in FIG. 20B are formed. The anodic oxidation continued until the diameter of Si quantum wires is in the range of from 40 to 50 angstroms.

In this manner, the porous Si layer 301 of quantum size was formed on the surface region of the polycrystalline layer 306 immersed in the HF aqueous solution.

Instead of the p-type polycrystalline layer 306, an acceptor doped p-type amorphous Si layer may also be used. In this specification, the term "polycrystalline Si" includes "amorphous Si" unless an exception to such is definition is specifically stated.

Figure 19B:
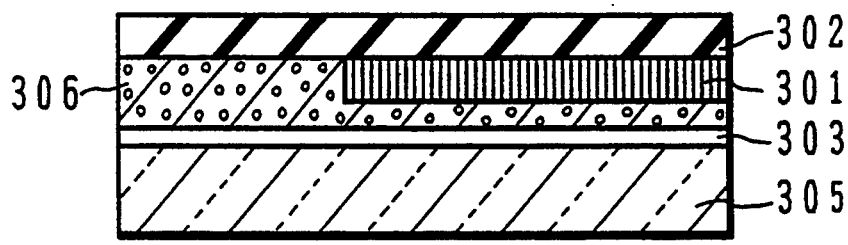

As shown in FIG. 19B, on the porous Si layer 301, an n-type conductive polymer layer 302 was deposited. Specifically, polyvinyl alcohol (PVA) and iron trichloride (FeCl$_3$) were dissolved in water (or ethyl alcohol), the solution was coated onto the surface of the Si layer by means of spin coating, and the coating was polymerized by a dry, thermal treatment. FeCl$_3$ is an oxidizing (accelerating) agent for polymeriziing PVA.

The polyvinyl alcohol film thus formed was cooled to $-15°$ C. and the cooled film was exposed to pyrrole vapor to obtain a polypyrrole derivative (a composite film of polypyrrole and polyvinyl alcohol). With such a vapor film forming method, an n-type conductive polymer layer 302 was formed.

The conductive polymer layer 302 may be formed by a method other than the foregoing vapor film forming method. For example, a polymerization method or an electrochemical film forming method may be used. With the polymerization method, a mixture of PVA, pyrrole, and FeCl$_3$ is dissolved in water (or ethyl alcohol), coated, dried and heated to form a composite film of polypyrrole and polyvinyl alcohol. With the electrochemical film forming method, a polycrystalline Si layer is immersed in a mixed solution of PVA, pyrrole, and FeCl$_3$ polymerization and deposit is caused to occur by applying an electric field.

The details of the method of forming a conductive polymer layer are described, for example, in T. Ojio and S. Miyata, Polymer Journal, 18, 95 (1986), Y. E. Whang, J. H. Han, T. Motobe, T. Watanabe and S. Miyata, Synthetic Metals, 45, 151 (1991), and J. H. Han, T. Motobe, Y. E. Whang and S. Miyata, Synthetic Metals, 45 261 (1991), which references are incorporated herein by reference.

Figure 19C:
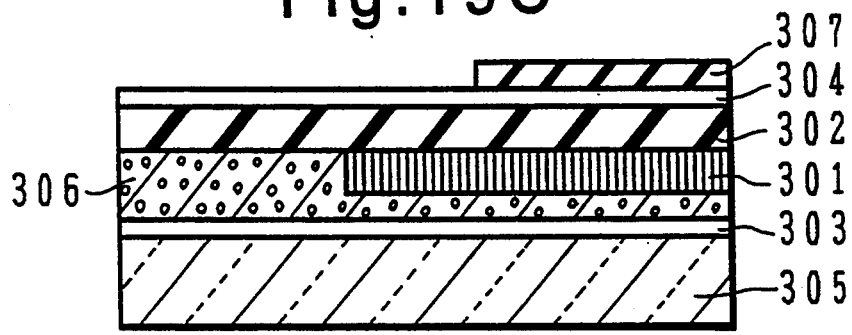

As shown in FIG. 19C, an ITO film to serve as the electrode 304 for the polymer layer was sputtered onto the layer 302. A photoresist film was coated on the electrode 304 to form an etching mask 307 by means of exposure and development.

Figure 19D:
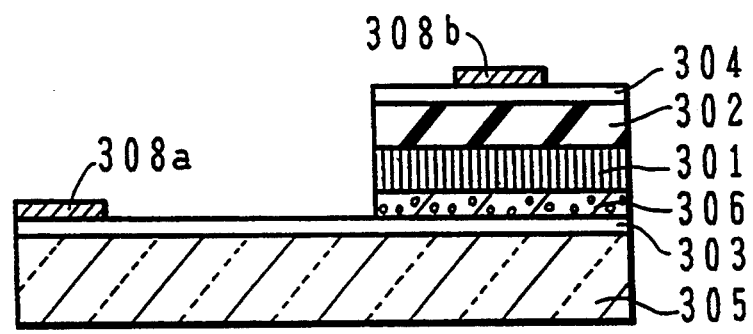

As shown in FIG. 19D, using the mask 307, the ITO electrode 304 was sputter-etched and thereafter the conductive polymer layer 302 was ashed in oxygen plasma.

Then, the polycrystalline layer 306 was etched in chlorine-based (or fluorine-based) gas plasma to expose the ITO electrode 303 for the Si layer. Thereafter, the etching mask 307 was removed.

Ohmic contacts 308$a$ and 308$b$ of a material such as Al were formed on the ITO electrodes 303 and 304 to complete the Si light emitting device.

The conductive polymer layer 302 couples at least the top surface areas of the Si quantum wires at region 301 to improve the mechanical strength of the otherwise brittle porous Si layer 301. In this context, the electric field polymerization film forming method is particularly suitable because the conductive polymer layer 302 fills the upper portions of pores 311 under the electric field.

With the above-described method, a device having a large area can be easily manufactured. For example, a display of an X-Y matrix type can be manufactured by this method.

Figure 2B:
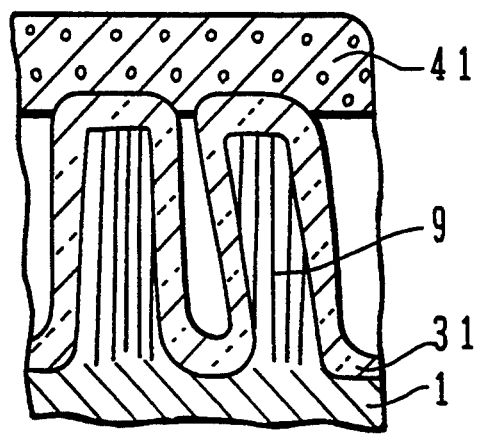
Figure 21A:
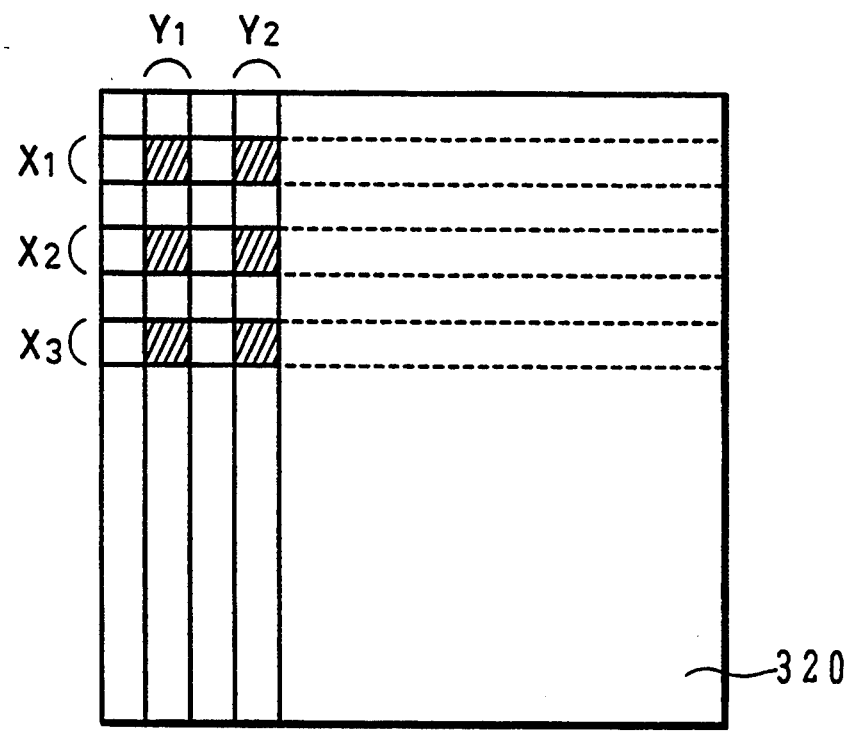
FIGS. 21A and 21B are a plan view and a schematic perspective view respectively of an X-Y matrix display device.
Figure 21B:
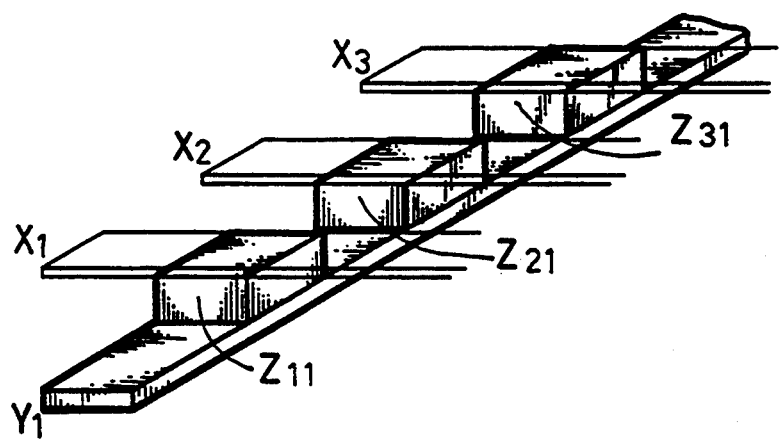

FIGS. 21A and 2B show a display device having a number of independent Si light emitting elements Zn disposed in a matrix form on a transparent insulating substrate. FIG. 21A is a plan view, and FIG. 21B is an enlarged perspective view showing some pixels.

On a substrate 320 there are formed a plurality of Si layer strip electrodes (lower transparent electrodes) Ym, and on these electrodes Ym there are formed light emitting elements Zn, each constituted by a p-type porous Si layer and an n-type conductive polymer layer. On these light emitting elements Zn there are formed electrode (upper metal electrodes) Xp for the conductive polymer electrode. It is apparent for those skilled in the art to perform a flattening process prior to forming the upper metal electrodes.

Light is radiated from the Si light emitting element and from the bottom side of the lower transparent substrate. Therefore, the strip electrodes Ym are required to be transparent, whereas the electrodes Xp may be metal (opaque). Using metal of a high reflection factor will raise the external quantum efficiency. Of the matrix light emitting elements, only an element Zn which is supplied with a signal voltage emits light. A switching transistor or the like may be coupled to each light emitting element.

Each Si light emitting element emits light at a forward bias voltage of 5 V or higher or a reverse bias voltage of about 209 V. The light emission intensity depends on the applied voltage (and therefore the current flowing through the element), whereas the light emission wavelength depends on the diameter of the Si quantum wires. The smaller the diameter, the shorter the wavelength of the emitted light.

Instead of the back surface light emission type, a front surface light emission type may be used. In this case, the upper electrodes are transparent. Instead of the insulating substrate, a Si single crystal substrate and a p-type single crystal Si layer may be used.

As the conductive polymer, other polypyrrole derivatives may be used, or polyaniline or polyacetylene derivatives may be used. However, polyaniline and polyacetylene derivatives have poor durability in an oxygen atmosphere.

With the embodiments shown in FIGS. 19A to 21B, a Si light emitting device with improved mechanical strength can be manufactured relatively easily using porous quantum wire Si.

SiC materials usable as light emission materials include 6HSiC ($\alpha$-SiC) which is conventionally used for blue diodes and 3CSiC ($\beta$-SiC) which can be epitaxially grown on a Si substrate. The band gap of $\beta$-SiC is 2.2 eV, the corresponding wavelength to which is not blue.

When $\beta$-SiC is transformed into a cluster of quantum wires, the effective band gap extends to 2.3 to 2.8 eV, for example, by the quantum size effects and the like. The value at the high energy side corresponds to blue to purple.

Therefore, a blue light emitting device of a high efficiency can be manufactured in principle by using quantum wires made from $\beta$-SiC, because of the extended band gap and pseudo direct gaps.

To the cluster of p-type SiC quantum wires, an n-type SiC thin film or transparent conductive thin film is coupled. This coupled structure is biased in a forward direction or a reverse direction so that recombination radiation generated from the p-type SiC quantum wire cluster is radiated to the outside of the thin film.

Figure 22A:
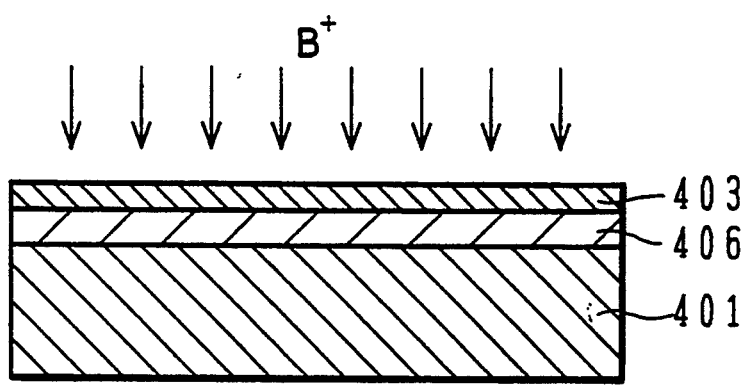
FIGS. 22A to 22C are schematic cross-sectional views illustrating the main processes of a method of manufacturing a semiconductor light emitting device according to another embodiment of the invention.
Figure 22B:
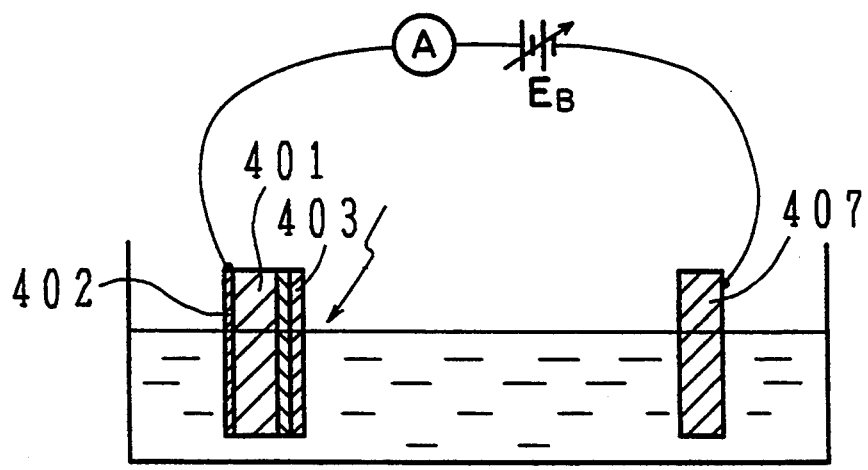
Figure 22C:
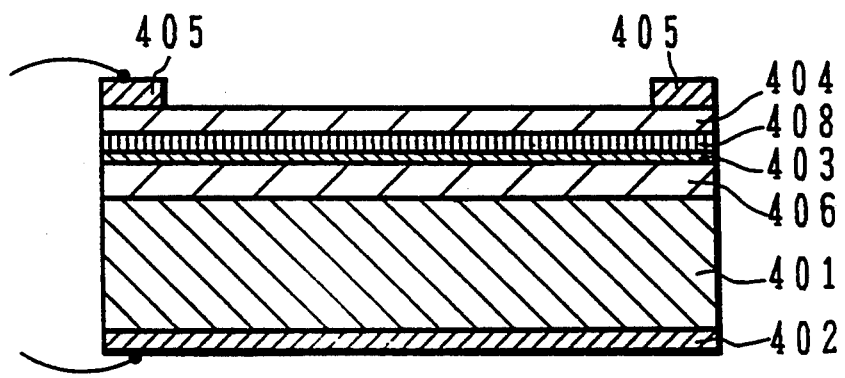

FIGS. 22A to 22C are schematic cross-sectional views showing the main steps of a method of manufacturing a semiconductor light emitting device according to another embodiment of the present invention.

As shown in FIG. 22A, on a p-type Si single crystal substrate 401 having a (111) surface, a $\beta$-SiC film was epitaxially grown by low pressure CVD. Specifically, on the p-type Si single crystal substrate 401 heated to 1000° C., there was formed an undoped intrinsic $\beta$-SiC layer 406 having a thickness of several $\mu$m using a mixed gas containing trichlorosilane and propane as a source gas and hydrogen as a carrier gas.

The substrate was heated, for example, through induction heating of carbon susceptor at several KHz. The $\beta$-SiC grown on the bottom surface of the substrate was removed in CF4 plasma.

As shown in FIG. 22A, group III elements such as boron were ion injection into the surface region of the intrinsic SiC layer 406 to form a p-type SiC layer 403. The injection was performed at an acceleration voltage of 150 kV using a dose of $10^{15}$ cm$^{-1}$. After ion injection, the thermal treatment was performed for 30 minutes at a temperature in the range of from 900° to 1000° C. to activate the boron ions B+.

Next, the bottom surface of the p-type Si single crystal substrate 401 was sputtered with Au (or Al) and subjected to a thermal treatment (300° C., 30 minutes) to form a p-side electrode 402 as shown in FIG. 22B.

Thereafter, as shown in FIG. 22B, the p-type SiC layer 403 was transformed into quantum wires.

Specifically, a current was applied between the p-side electrode 402 and a counter electrode 407 made of Au (or Pt), while both were immersed in an Hf aqueous solution (concentration 10 to 50 weight %).

The specimen was connected to the anode of a d.c. voltage source and a current having a density in the range of from 1 to 10 mA/cm$^2$ was caused to flow while strong ultraviolet rays emitted from a W lamp (or another lamp) were applied to the surface of the p-type SiC layer 403. Instead of the HF aqueous solution, an alcohol diluted HF aqueous solution may be used.

Application of ultraviolet rays increases the conductivity of the p-type SiC layer 403 because of the generation of electron-hole pairs within the layer, and so the anodic oxidation progresses with the help of holes.

Pores were generated at a high density on the surface of the p-type SiC layer 406 and the same were extended in the depth direction to form a cluster of quantum wires having a diameter of several nm. When the diameter reached an experimentally predetermined value, the anodic oxidation was terminated, and the sample was washed with pure water and dried.

Next, as shown in FIG. 22C, an n-type SiC layer 404 was deposited to a thickness of several thousands angstroms at a low temperature of 400° C. (or lower) on the quantum wire region 408 by means of low pressure CVD. In growing the n-type SiC, PH3 was introduced as the dopant. Sputtering may be performed using a shaped target of n-type SiC.

Instead of n-type SiC, a transparent conductive layer such as an ITO film and a metal layer such as a very thin Au layer may be used.

The portion of the p-type SiC layer 403 which was not immersed in the HF aqueous solution during the process shown in FIG. 22B was not transformed into quantum wires. This portion was selectively etched out, and an Au metal layer (Al metal layer may be used instead) was selectively deposited on the n-type SiC layer 404 and patterned to form an n-side electrode 405. Lead wires were connected to the electrodes 402 and 405 to complete the light emitting semiconductor device such as shown in FIG. 22C.

When a forward voltage of several V or a reverse voltage over 20 V was applied between the lead wires of the light emitting device, electrons which were injected into the quantum wire region 408 of the p-type SiC recombined with holes and light was emitted. The color of emitted light was blue for a quantum wire diameter of 5 to 6 nm, and purple for the a diameter of 3 to 4 nm.

A full color display device may be manufactured using as a blue light emitting diode a device having the above-described p-type SiC quantum wire region as the light emission layer. Conventional red and green light emitting diodes may be used. If light emitting diodes having Si quantum wires are used for all colors, the display device can be integrally formed on a single substrate.

Figure 23A:
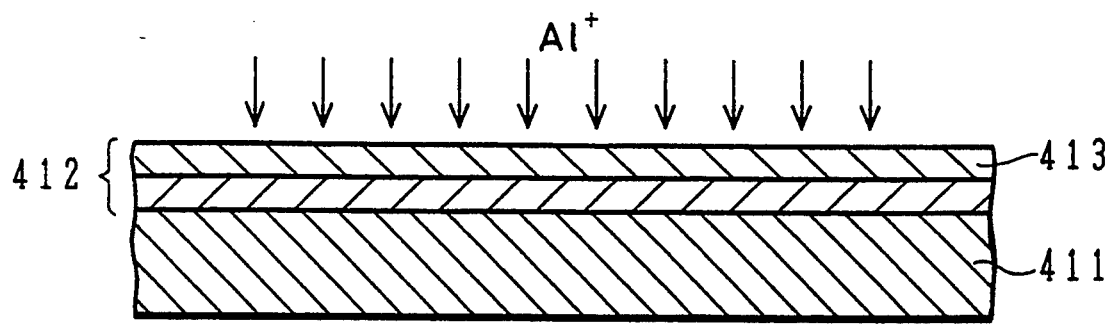
FIGS. 23A to 23C are schematic cross-sectional views illustrating the main processes of a method of manufacturing a full color display device according to another embodiment of the invention.
Figure 23B:
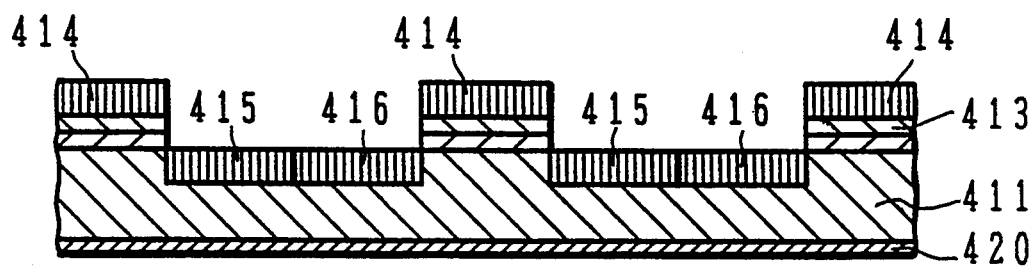
Figure 23C:
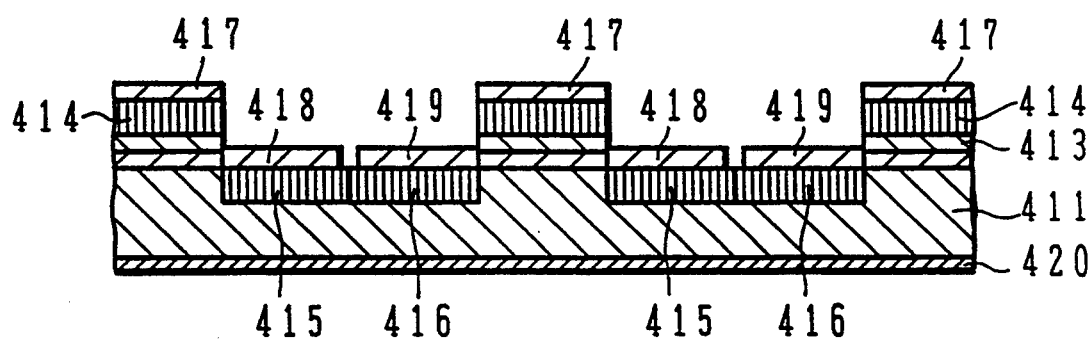

FIGS. 23A to 23C illustrate the main steps of a method of manufacturing a full color display device. First, as shown in FIG. 23A, on a p-type Si wafer 411, a SiC layer 412 was formed by low pressure CVD. Ions were injected into the SiC layer 412 to make it a p-type layer. The injected ions were of group III elements such as Al. Other elements may also be used. As a result, a p-type SiC layer 413 was formed over the whole surface.

Next, patterning was performed as shown in FIG. 23B. A protective film of a material such as SiO$_2$ was deposited and a photoresist film was coated thereon. Using a general photolithography technique, a mask was formed having openings at the areas where blue light diodes are not formed.

Anisotropic etching was performed in CF$_4$ plasma to remove SiC at the openings. SiC on the bottom surface of the p-type Si wafer was also removed. Thereafter, the mask was stripped.

An Au back electrode 420 was sputtered onto the p-type Si wafer 411, and a quantum wire cluster was formed like those described in connection with FIG. 22B by means of the anodic oxidation.

The anodic oxidation was performed three times for blue, red, and green colors. During each process of forming a quantum wire cluster at regions of one color, the regions of the other two colors were covered with a protective film such as a photoresist film.

As shown in FIG. 23B, the SiC quantum wire regions 414 for blue color diodes were formed in the p-type SiC layer 413, and the Si quantum wire regions 415 and 416 for red and green color diodes were formed in the p-type Si wafer 411. The diameters of the quantum wires in Si quantum wire region 415 were larger than those of region 416.

In FIGS. 23A to 23C, a pattern of blue, red, and green regions has been described. Any other patterns may be selected.

Next, as shown in FIG. 23C, transparent electrodes 417, 418, and 419 were vapor-deposited on the respective regions 414, 415, and 416, and the same electrically separated from adjacent electrodes. The transparent electrodes were formed from an ITO film having a thickness of about 2000 angstroms, and a single electrode was provided for a set of blue, red, or green elements to be simultaneously excited.

Lead wires were connected to the transparent electrodes 417, 418 and 419 to back electrode 420 to complete a full color display device. A forward voltage of several V or higher or a reverse voltage of 25 V or higher was applied between these electrodes.

Strip back electrodes 420 and strip transparent electrodes 417, 418 and 419 may be formed in a perpendicularly crossing pattern so as to assign each light emitting element with an intersection between upper and lower strip electrodes. In this case, the respective light emitting elements can be activated selectively.

The pattern of electrodes may be changed in various ways. For example, predetermined strip wells may be formed on the surface of the Si substrate 401 for use as electrodes. Each light emitting element may be provided with a switching transistor. The p-type SiC layer is not necessarily a single crystal, but other materials such as polycrystalline SiC may be used.

As described above, with the embodiments shown in FIGS. 22A to 23C, light emitting devices can be manufactured which produce light emission at shorter wavelengths than the band gap of SiC. It is also possible to manufacture a color display of a large size relatively easily.

In order to form a porous SiC semiconductor layer, strong ultraviolet rays have conventionally been applied during the anodic oxidation. The etching efficiency of SiC during anodic oxidation is very sensitive to the intensity of the applied ultraviolet rays so that it is difficult to stably control of the size of the fine structure of the porous SiC ($\beta$-SiC) when ultraviolet rays are applied.

FIGS. 24A to 24D are schematic diagrams illustrating a method of forming a $\beta$-SiC porous semiconductor layer without application of ultraviolet rays.

Figure 24A:
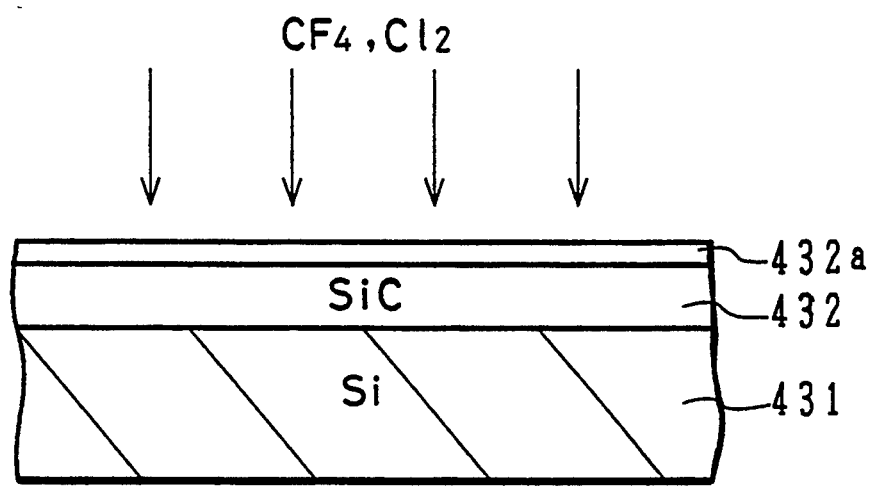
FIGS. 24A to 24D are schematic diagrams illustrating the main processes of a method of manufacturing a porous semiconductor light emitting device according to an embodiment of the invention.

First, as shown in FIG. 24A, on a p-type SiC substrate 431 having a (111) surface and which is heated to about 1000° C., a $\beta$-SiC layer 432 was formed to a thickness of several $\mu$m by CVD using trichlorosilane and propane as the source gas and hydrogen as the carrier gas.

Next, the surface of the $\beta$-SiC layer 432 was subjected to an ion irradiation process in a reactive ion etching apparatus. The irradiated ions were ions which are reactive with SiC, such as ions of CF$_4$ and Cl$_2$.

By such ion irradiation, a surface layer 432a was formed on the SiC layer 432. It is conceivable that the surface layer 432a has fine irregularities because of the reactive ion irradiation.

Figure 24B:
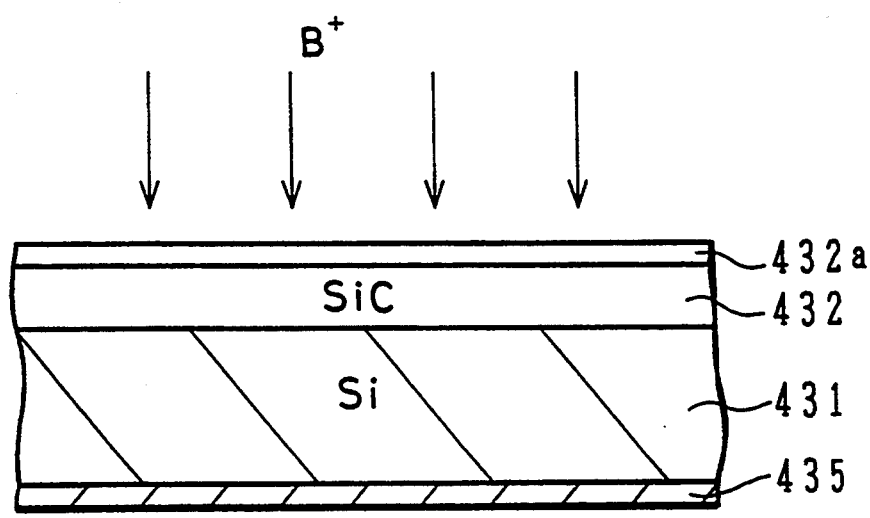

FIG. 24B illustrates an ion injecting process for controlling the porosity of the SiC layers 432 and 432a.

The SiC layers 432 and 432a which had been subjected to the ion irradiation, where injected with p-type impurities such as B+ ions at an acceleration voltage in the range of from several tens to several hundred KeV at a dose of about $10^{15}$ cm$^{-2}$ or less. It is preferable to use a p-type semiconductor layer for anodic oxidation in an HF aqueous solution.

It is possible to control the size of the quantum wire structure by controlling the p-type impurity concentration. In this embodiment, the does of injected ions was controlled so as to form fine quantum wires.

Figure 24C:
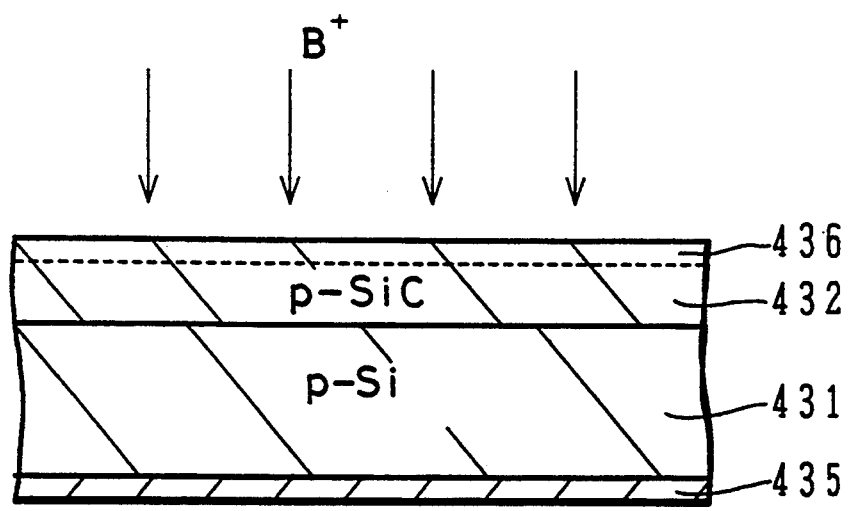

After injection of the p-type impurity ions, Au was sputtered onto the back surface of the Si substrate 431 to form an ohmic electrode 435. The wafer was then immersed in an HF aqueous solution to perform the anodic oxidation. With the anodic oxidation, the SiC layers 432 and 432a were made porous and a porous semiconductor layer 436 was obtained as shown in FIG. 24C.

P-type impurities such as B+ ions were then injected at an acceleration voltage of 150 KeV and at a dose of about $10^{15}$ cm$^{-2}$ to form a pn junction in the porous semiconductor layer 436.

Figure 24D:
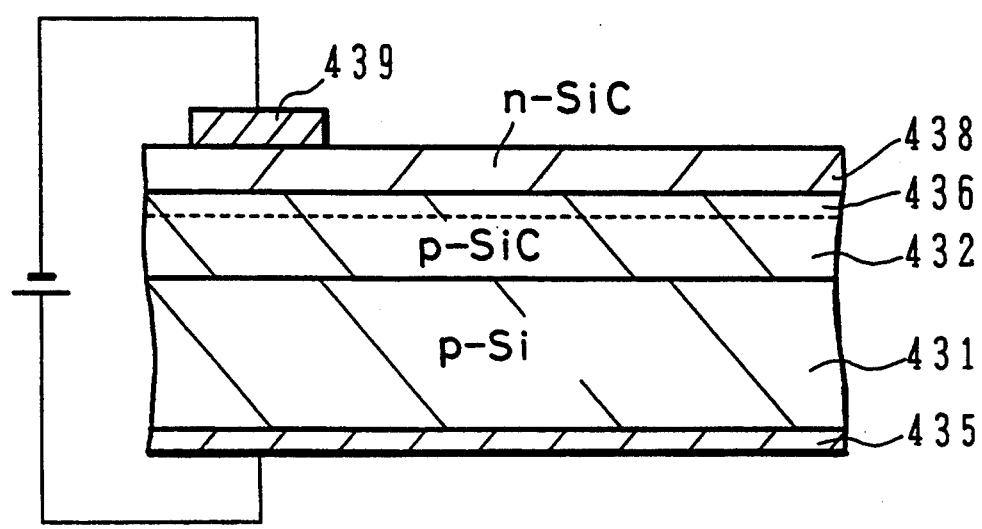

Next, as shown in FIG. 24D, the porous $\beta$-SiC layer 436 which had been injected with p-type impurity ions was washed in pure water, and an n-type SiC layer 438 formed thereon to a thickness of several thousands angstroms by CVD (or sputtering).

Instead of the n-type SiC layer 438, a metal film such as sputtered Au or an ITO film may be formed on layer 436. After forming the n-type $\beta$-SiC layer 438, a contact electrode 439 of a material such as Au was formed on a portion of the surface of the n-type $\beta$-SiC layer 438.

A forward bias voltage was applied between the electrodes 435 and 439. Light emission was produced from the porous SiC layer 436.

The speed of forming the porous semiconductor layer improved about 1.5 to 2.0 times when the ion irradiation process described in connection with FIG. 24A was performed.

The surface process wherein reactive ions are used prior to anodic oxidation for obtaining the porous region may be effective not only for SiC but also for other semiconductor layers.

Light emission from the porous semiconductor layer was produced by the recombination of electron-hole pairs within the layer. It is not necessary for the electron-hole pairs to be generated by current injection.

Figure 25:
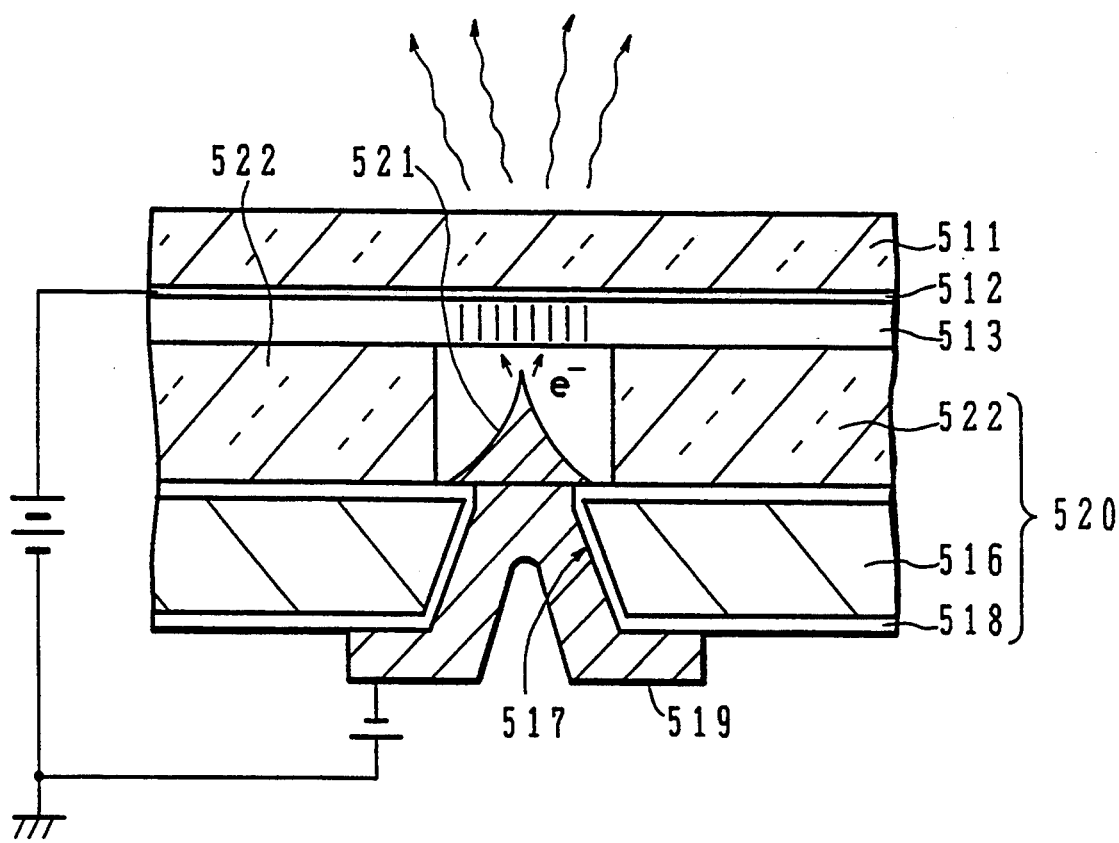
FIG. 25 is a schematic cross-sectional view showing the structure of a porous semiconductor light emitting device according to another embodiment of the invention.

FIG. 25 is a schematic cross-sectional view of a porous semiconductor light emitting device according to another embodiment of the present invention.

On a surface (lower side as viewed in FIG. 25) of a quartz substrate 511, an ITO film 512 was formed and a polycrystalline Si layer was formed on film 512. This polycrystalline Si layer was subjected to the anodic oxidation in an HF aqueous solution to form a porous semiconductor layer 513. The regions around the light emission region were not subjected to anodic oxidation, and were left unchanged.

The anodic oxidation was performed using an HF aqueous solution having an HF concentration in the range of from 10 to 50 weight % and at a current density in the range from 20 to 100 mA/cm$^2$ to form a porous layer having a thickness of several hundreds to several μm. After the anodic oxidation, the wafer was washed in an HF aqueous solution and the same was then washed in water for a sufficient time. Thereafter, in an oxygen atmosphere at a temperature in the range of from 800° to 900° C. and at a pressure of several Torr, annealing was performed for several tens of minutes. With this annealing, a very thin stabilized oxide film was formed.

A field emitter 520 was bonded to the porous semiconductor layer 513 in an air tight state by means of an oxide film 522. The field emitter 520 was provided with a Si electron emitter 521 having a sharp tip which was formed above an opening 517 of a Si substrate 516. The surface of the Si substrate was covered with an oxide film 518. A metal electrode 519 formed from a material such as W was formed around the opening 517 and this electrode was electrically connected to the electron emitter 512.

When a sufficiently strong electric field was applied to the tip of the electron emitter 521, electrons were emitted from the tip and injected in the porous semiconductor layer 513. Such electron injection caused electron-hole pairs to be generated within the porous semiconductor layer 513 and the recombination thereof produced light emission.

FIGS. 26A to 26F illustrate a method of forming the field emitter 520 show in FIG. 25.

Figure 26A:
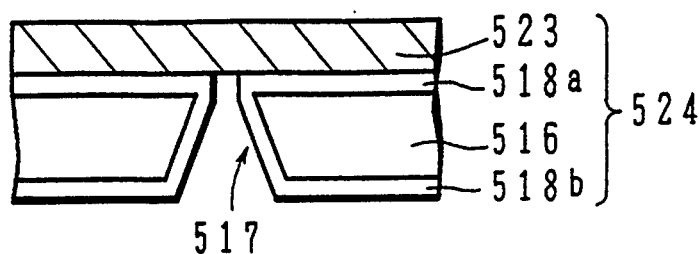
FIGS. 26A to 26F are schematic cross-sectional views illustrating the processes of manufacturing a field emitter used for the porous semiconductor light emitting device shown in FIG. 25.

As shown in FIG. 26A, first an SOI substrate 524 was prepared which had a laminated structure of an Si substrate 516, an oxide film 518a, and a Si layer 523. A mask having a rectangular opening was formed and placed on the Si substrate 516 to form an opening 517 through anisotropic etching with KOH.

The oxide film 518a at the opening was etched away in a diluted HF aqueous solution to cause the opening 517 to reach to the Si layer 523.

After removing the mask, the bare Si surface was oxidized to form a oxide film 518b. After covering only the window of the opening with a mask, reactive ion etching (RIE) was performed to etch the oxide film 518b at the window of the opening 517 and expose the Si layer 523. The mask was then removed.

Figure 26B:
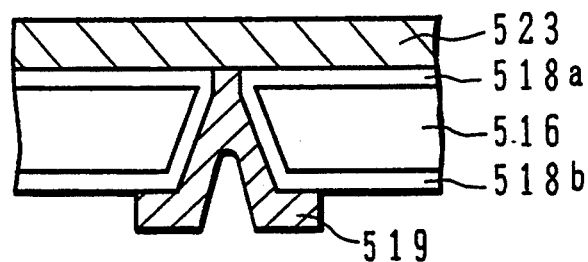

Next, as shown in FIG. 26B, a metal layer was formed so as to cover the opening 517, and this layer was patterned to form wiring 519. The metal layer was formed from W (other metals may also be used).

Figure 26C:
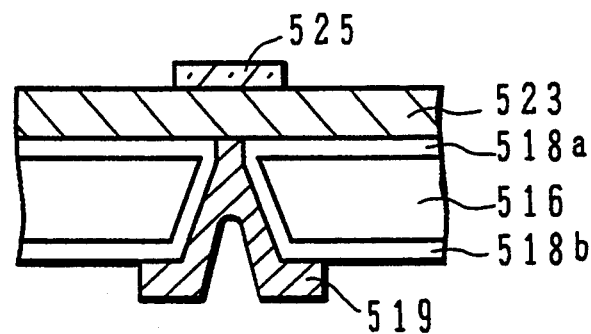

Next as shown in FIG. 26C, a silicon oxide film was grown to a thickness of about 0.5 μm on the Si layer 523, and such film was patterned to form an oxide film mask 525.

Figure 26D:
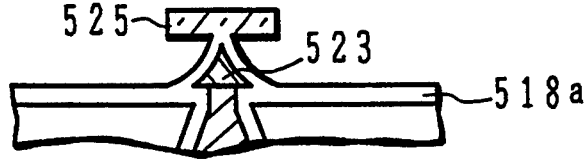

Next, as shown in FIG. 26D, reactive ion etching (RIE) was performed using CF$_4$ to etch the Si layer 523 leaving a Si region 523 just under the oxide film mask 525.

Figure 26E:
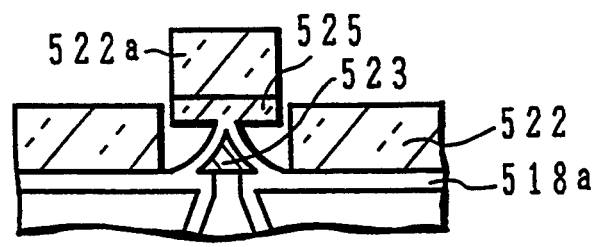

The surface of the exposed Si region 523 was oxidized to form a sharp edged Si tip 523. Thereafter, as shown in FIG. 26E, an oxide film 522 was deposited by CVD.

Figure 26F:
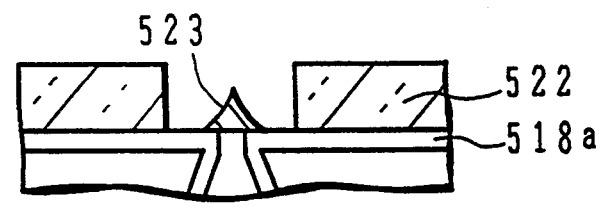

Next, as shown in FIG. 26F, the oxide film 522 was etched in a dilute HF aqueous solution to remove both of the oxide films 525 and 522a. During this process, the oxide film on the surface of the Si tip 523 was also removed.

In this manner, a sharp edged Si emitter 523 was formed. The Si emitter 523 was surrounded by a thick oxide film 522.

This Si emitter was placed on the porous semiconductor layer and bonded thereto in a vacuum state to complete a field emitter having an evacuated interior. A number of such field emitters may be formed in an array on an SOI substrate.

In this embodiment, although the field emitter is provided for a Si porous semiconductor layer, it may also be provided for a SiC porous semiconductor layer.

We claim:

1. A method of manufacturing an Si light emitting device comprising the steps of:
   providing an Si layer having a first conductivity type;
   forming a metal electrode on a surface of said Si layer;
   performing an anodic oxidation by immersing said Si layer in an aqueous solution of hydrofluoric acid and forming a porous region containing a cluster of Si quantum wires on said surface of said Si layer;
   forming an oxidized layer by oxidizing an exposed surface of said Si layer in an oxidizing atmosphere;
   depositing a highly doped Si or SiC layer having a second conductivity type opposite to the first conductivity type of said Si layer on the oxidized layer above said porous region; and
   depositing a transparent conductive film on said Si or SiC layer.

2. A method of manufacturing an Si light emitting device comprising the steps of:
   providing an Si layer;
   forming a metal electrode on a surface of said Si layer;
   performing an anodic oxidation by immersing said Si layer in an aqueous solution of hydrofluoric acid and forming a porous region containing a cluster of Si quantum wires on said surface of said Si layer;
   rinsing said porous layer with pure water to increase the transition energy of said porous region for recombination light emission; and
   forming a carrier supply layer on said porous region.

3. A method according to claim 2, wherein said carrier supply layer is a highly doped Si or SiC layer having a conductivity type opposite to the conductivity type of said Si layer, and said method includes depositing a transparent conductive film on said Si or SiC layer.

4. A method according to claim 2, wherein said carrier supply layer includes a transparent conductive film, said film being formed directly on said porous region.

5. A method accordingly to claim 2, wherein said hydrofluoric acid aqueous solution contains 10 to 50 weight % hydrofluoric acid, and said anodic oxidation step is performed at a current density of 10 to 100 mA/cm$^2$.

6. A method according to claim 2, wherein said Si layer is formed by depositing a polycrystalline Si layer on a support substrate.

7. A method according to claim 2, wherein said rinsing step is performed by immersing the porous layer in pure water while applying ultrasonic waves to said water.

8. A method of manufacturing a porous semiconductor device comprising the steps of:
performing an anodic oxidation of an Si or SiC semiconductor layer in an aqueous solution of hydrofluoric acid to form a porous semiconductor layer;
performing an anodic oxidation of an Si or SiC semiconductor layer in an aqueous solution of hydrofluoric acid to form a porous semiconductor layer; and
immersing said porous semiconductor layer in pure water.

9. A method according to claim 8, wherein said pure water immersion step is performed while applying ultrasonic waves to the water.

10. A method according to claim 8, wherein said pure water immersion step includes a step of immersing said porous semiconductor layer in heated pure water.

11. A method of manufacturing a porous semiconductor light emitting device comprising the steps of:
performing an anodic oxidation of an Si or SiC semiconductor layer in an aqueous solution of hydrofluoric acid to form a porous semiconductor layer; and
annealing said porous semiconductor in a vapor containing atmosphere.

12. A method of manufacturing a porous semiconductor light emitting device comprising the steps of:
performing an anodic oxidation of an Si or SiC semiconductor layer in an aqueous solution of hydrofluoric acid to form a porous semiconductor layer; and
exposing said porous semiconductor layer to a fluorine gas atmosphere.

13. A method of manufacturing a porous semiconductor light emitting device comprising the steps of:
irradiating reactive ions on the surface of an Si or SiC semiconductor layer; and
performing an anodic oxidation of said semiconductor layer in an aqueous solution of hydrofluoric acid to form a porous semiconductor layer thereon.

14. A method according to claim 13, wherein said reactive ions are ions generated from a $CF_4$ or $Cl_3$ plasma gas.

15. A method according to claim 14, further comprising a step of injecting p-type impurity ions into said semiconductor layer prior to said anodic oxidation step.

16. A method according to claim 15, further comprising a step of injecting p-type impurity ions into said semiconductor layer after said anodic oxidation step.

17. A method of manufacturing an Si light emitting device comprising the steps of:
preparing an SOI substrate having a laminated structure comprising an Si layer, an insulating layer, and a support substrate;
forming an opening in said support substrate and said insulating layer;
forming a back contact electrode on a bottom surface of said support substrate covering said opening;
performing an anodic oxidation of said Si layer in an aqueous solution of hydrofluoric acid to form a porous Si region thereon; and
forming an n-type region and a p-type region in said Si layer sandwiching said porous Si region.

18. A method according to claim 17, further comprising the steps of:
forming an Si oxidized film on said Si layer by thermally oxidizing the surface of said Si layer after said anodic oxidation step; and
depositing Si on said Si oxidized film by low pressure vapor deposition.

19. A method according to claim 18, wherein said back contact electrode is formed of a metal which is resistant to said hydrofluoric acid aqueous solution, said anodic oxidation step being performed by immersing said SOI substrate in said hydrofluoric acid aqueous solution, said method further comprising a step of removing said back contact electrode after said Si depositing step through low pressure vapor deposition.

20. A method according to claim 18, wherein said back contact electrode is formed of an oxidizable metal, said anodic oxidation step being performed without immersing said back contact electrode in said hydrofluoric acid aqueous solution, said method further comprising a step of oxidizing and changing said back contact electrode to an insulating layer.

21. A method of manufacturing an Si light emitting device comprising the steps of:
forming a porous Si region of quantum wires in a p-type Si layer; and
depositing an n-type conductive polymer layer on said porous Si region using an electrochemical film forming method or a vapor film forming method.

22. A method according to claim 21, wherein said p-type Si layer is a polycrystalline Si layer, and said porous Si region forming step includes a step of forming a quantum wire Si region by anodic oxidation of said polycrystalline Si layer in an aqueous solution of hydrofluoric acid, said quantum wire Si region being formed so as to present a number of pores contiguous to each other on the surface layer of said polycrystalline Si layer.

23. A method of manufacturing a semiconductor light emitting device comprising the steps of:
growing a p-type SiC layer on a p-type Si single crystal substrate;
forming a quantum wire cluster in a surface region of said p-type SiC layer by anodic oxidation of said p-type SiC layer in an aqueous solution of hydrofluoric acid or alcohol diluted hydrofluoric acid; and
depositing an n-type SiC layer of a transparent conductive layer on said quantum wire cluster in a vapor phase.

24. A method according to claim 23, wherein ultraviolet rays are applied to the surface region of said p-type SiC layer during said anodic oxidation step.

* * * * *

UNITED STATES PATENT AND TRADEMARK OFFICE
CERTIFICATE OF CORRECTION

PATENT NO. : 5,427,977
DATED : June 27, 1995
INVENTOR(S) : MASAO YAMADA et al.

It is certified that error appears in the above-indentified patent and that said Letters Patent is hereby corrected as shown below:

Title page - Item [30] first entry, delete "4-138075" and substitute --4-138074--.

* Column 7, line 47, delete "wit" and substitute --with--.

* Column 13, line 15, delete "preformed" and substitute --performed--.

Column 29, line 51, delete "Cl$_3$"and substitute --Cl$_2$--.

Signed and Sealed this

Tenth Day of October, 1995

Attest:

BRUCE LEHMAN

Attesting Officer

Commissioner of Patents and Trademarks